(12) United States Patent
Dong et al.

(10) Patent No.: US 8,508,308 B2
(45) Date of Patent: Aug. 13, 2013

(54) AUTOMATIC FREQUENCY CALIBRATION OF A MULTI-LCVCO PHASE LOCKED LOOP WITH ADAPTIVE THRESHOLDS AND PROGRAMMABLE CENTER CONTROL VOLTAGE

(75) Inventors: Yikui Jen Dong, Cupertino, CA (US); Freeman Y. Zhong, San Ramon, CA (US); Tai Jing, Los Altos, CA (US); Chaitanya Palusa, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 78 days.

(21) Appl. No.: 13/223,418

(22) Filed: Sep. 1, 2011

(65) Prior Publication Data

US 2013/0057325 A1 Mar. 7, 2013

(51) Int. Cl.
*H03L 7/085* (2006.01)

(52) U.S. Cl.
USPC ............... 331/179; 327/147; 331/2; 331/10; 331/14; 331/16; 331/17; 331/44; 331/49; 375/376

(58) Field of Classification Search
USPC ............ 327/147, 156; 331/2, 10, 14, 16, 331/17, 44, 46, 48, 49, 56, 179; 375/373, 375/376
See application file for complete search history.

(56) References Cited

U.S. PATENT DOCUMENTS

| | | | | |
|---|---|---|---|---|
| 4,510,461 A * | 4/1985 | Dickes et al. | ............... | 331/1 A |
| 5,686,864 A * | 11/1997 | Martin et al. | ............... | 331/1 A |
| 6,512,801 B1 * | 1/2003 | Ninomiya | ............... | 375/316 |
| 6,583,675 B2 * | 6/2003 | Gomez | ............... | 331/17 |
| 6,774,732 B1 * | 8/2004 | Harnishfeger et al. | ...... | 331/25 |
| 6,933,789 B2 * | 8/2005 | Molnar et al. | ............... | 331/2 |
| 7,068,989 B2 * | 6/2006 | Yonekura | ............... | 455/260 |
| 7,155,188 B2 * | 12/2006 | Noboru et al. | ............... | 455/255 |
| 7,474,358 B2 * | 1/2009 | Miyamoto | ............... | 348/723 |
| 7,519,140 B2 * | 4/2009 | Yoshimura | ............... | 375/376 |
| 7,834,705 B2 * | 11/2010 | Seo et al. | ............... | 331/2 |
| 7,940,140 B2 * | 5/2011 | Zeng et al. | ............... | 331/179 |
| 2005/0179501 A1 | 8/2005 | Natonio et al. | | |
| 2010/0117741 A1 * | 5/2010 | Goto | ............... | 331/17 |

OTHER PUBLICATIONS

Jaewook Shin and Hyunchol Shin, "A Fast and High-precision VCO Frequency Calibration Technique for Wideband delta-sigma Fractional-N Frequency Synthesizers", IEEE Transactions on Circuits and Systems, vol. 57, No. 7, Jul. 2010.

* cited by examiner

*Primary Examiner* — Levi Gannon

(57) ABSTRACT

Described embodiments provide a method of calibrating, by a calibration engine, a phase-locked loop (PLL) having one or more adjustable oscillators. The method includes entering a calibration mode of the PLL. The PLL is set to an initial state, thereby selecting one of the adjustable oscillators for calibration, an initial threshold window, and an initial tuning band of the selected adjustable oscillator. If the control signal of the selected adjustable oscillator is not within the initial threshold window, the calibration engine iteratively adjusts at least one of: (i) the selected tuning band of the selected adjustable oscillator, (ii) the selected adjustable oscillator, and (iii) the selected threshold window until the control signal of the selected adjustable oscillator is within the adjusted threshold window. If the control signal is within the threshold window, the one or more calibration settings of the PLL are stored and used to set the PLL operation.

18 Claims, 20 Drawing Sheets

704

1600

1700

AUTOMATIC FREQUENCY CALIBRATION OF A MULTI-LCVCO PHASE LOCKED LOOP WITH ADAPTIVE THRESHOLDS AND PROGRAMMABLE CENTER CONTROL VOLTAGE

CROSS-REFERENCE TO RELATED APPLICATIONS

This application is related to U.S. patent application Ser. Nos. 12/156,607 filed Jun. 3, 2008 and 13/179,653 filed Jul. 11, 2011, the teachings of which are incorporated herein in their entireties by reference.

BACKGROUND OF THE INVENTION

1. Field of the Invention

The present invention relates to electronic circuits and, in particular, to calibrating a phase-locked loop incorporating multiple oscillators.

2. Description of the Related Art

A phase-locked loop (PLL) is widely used in communications systems for clock synthesis and generation. The PLL is a closed-loop frequency-control system based on the phase difference between the input clock signal and the feedback output signal of a controlled oscillator. FIG. 1 shows a typical PLL, PLL 100, having phase frequency detector (PFD) 102, charge pump 104, loop filter 106, tunable oscillator 108, and frequency divider 110. PLL 100 provides an output frequency signal based upon an input reference frequency signal. Phase detector 102 compares the phase of the output frequency (or a divided-down output frequency) to the reference frequency to generate a phase error signal corresponding to the difference between the reference frequency and the output frequency. The phase error signal from phase detector 102 is used to adjust the frequency of oscillator 108, by causing charge pump 104 to either pump current to, or sink current from, loop filter 106 based on the phase error signal. Loop filter 106 might be employed to smooth the output current from charge pump 104, and, if tunable oscillator 108 is a voltage controlled oscillator (VCO), loop filter 106 might also convert the output current, $I_{CP}$, of charge pump 104 to an input voltage to oscillator 108. This feedback loop generated control signal applied to oscillator 108 allows PLL 100 to keep the phases of the reference frequency and the output frequency matched, which allows PLL 100 to closely track the input frequency, or to generate a frequency that is a multiple of the input frequency when frequency division by frequency divider 110 is employed in the feedback loop.

The frequency range of oscillation of oscillator 108 directly determines the top and bottom oscillation rates of PLL 100. A common application of a PLL is in a serializer-deserializer (SERDES) device, and the range of standard clock signals a SERDES device can support, and its performance, is fundamental to the performance of the overall system employing the SERDES device. The top oscillation frequency, $R_j$ and $P_j$ levels (random and periodic jitter levels, respectively), tuning range (range of oscillation frequencies), and start-up margin are key performance measures for a PLL.

For the PLL of FIG. 1, a complimentary cross-coupled LCVCO architecture might be employed for oscillator 108, such as shown in FIG. 2. In general, a complimentary cross-coupled LCVCO might be suitable for system-on-chip (SoC) applications. LCVCO 108 comprises a cross-coupled differential amplifier 202 with an LC tank in its feedback path. This LC tank is composed of inductance provided by inductor 204 (with exemplary inductive value L1) and a capacitance provided by parallel-coupled varactors 208 (with exemplary capacitive values Var1) and switched capacitor banks 206 (with exemplary capacitive values C1). Switched capacitor banks 206 are optionally included to extend the tuning range of the VCO, for example by selecting a given tuning curve of the VCO. The VCO oscillates as given in equation (1):

$$\omega_{osc} = \{L \cdot (C_{tran} + C_{loud} + C_{reg} + C_{sweap} + C_{var})\}^{-1/2} \qquad (1)$$

where L is the inductance, $C_{tran}$ and $C_{loud}$ are the loadings from the negative $g_m$ transistors of the differential amplifier and the following stage circuitry, $C_{reg}$ is the circuit's routing and parasitic capacitance for the implementation, $C_{sweap}$ is the switched-capacitor bank capacitance, and $C_{var}$ is the varactor capacitance.

Implementing a wide-tuning range PLL is difficult for deep-submicron standard CMOS technology with high gate and channel leakage, such as 40 nm geometry CMOS technology integrated circuit (IC) chips. Further, the precise control of the target control voltage, Vtune, is important for setting the PLL to overcome a significant amount of PVT variations and balancing between random and periodic jitter performances. PLL VCO calibration might be performed during an initialization or reset of the PLL. PLL VCO calibration might be employed to select a given tuning curve of the VCO, for example using switched capacitor banks 206. Thus, the particular tuning curve chosen might need to tolerate PVT variation while maintaining acceptable PLL performance in the time between being chosen and a next reset of the PLL. Two distinct methods are commonly employed for automatic tuning of the frequency of LCVCOs: (i) open-loop calibration, and (ii) closed-loop calibration. A fundamental problem with open-loop calibration is that it requires breaking of the PLL loop and forcing an external voltage onto the sensitive Vtune control line. After calibration, although those calibration circuits are disabled, leakage paths might still exist, and disturbance and resulting jitter might be introduced.

In prior-art closed-loop calibration, the control voltage of the PLL is compared with two fixed voltages: an upper threshold voltage and a lower threshold voltage. These comparisons determine whether the frequency of the VCO is in range, or has to be increased or decreased. To ensure PLL frequency range, the two fixed thresholds are usually defined by the extremes of the allowable Vtune voltage range (e.g., a maximum Vtune value and a minimum Vtune value), such as shown in FIG. 4. As shown in FIG. 4, one or more tuning curves 302(1)-302(N) might fall within a window of output frequency operation of the PLL, as indicated by dashed lines $Vtune_{(min)}$, $Vtune_{(max)}$, $f_{o,min}$ and $f_{o,max}$. The maximum and minimum levels of Vtune might be determined by the characteristics of charge pump 104, for example when charge pump 104 enters the triode region of operation, as shown in FIG. 4. A fundamental problem with previous closed-loop calibration is that the threshold voltages are pre-set and fixed before calibration starts. In addition, these preset thresholds are usually at the operating voltage extremes in order to achieve the maximum possible frequency range of the PLL. Thus, as shown in FIG. 4, with the closed-loop calibration of the prior art, a fixed Vtune minimum and a fixed Vtune maximum are chosen as calibration lower and upper thresholds. As shown, these thresholds are typically chosen at the edge of the functional operation region to ensure frequency locking range in the uncertainty of VCO frequency-band overlap from the device modeling and extraction limitations during the design phase.

As shown in FIG. 5A, significant leakage current from the Vtune node might increase in deep submicron poly-gate CMOS technology, such as 40 nm TSMC CMOS technology, as technology geometries decrease in size. This leakage current might lead to periodic jitter of the PLL output. As shown in FIG. 5A, gate leakage from 0.9V 40 nm varactor is shown to be higher than 65 nm and 90 nm devices.

A fundamental problem with the previous art close-loop calibration method is that the threshold voltages are preset and fixed before the calibration starts. In addition, these preset thresholds are typically extreme voltages to ensure the operating frequency range of the PLL. Further, as shown in FIG. 5B, there is uncertainty of VCO frequency-band overlap from the device modeling and extraction limitations during the design phase. As a result, the frequency band chosen for a certain frequency at the end of the calibration is arbitrary, and highly depends on the initialized value when the calibration starts, no matter how well the underlying PLL circuit actually performs. Therefore, although a frequency might be well in the operating range of the PLL, and there are frequency bands available to offer that frequency with centered Vtune voltages, the calibration engine might choose a frequency band that requires an extreme Vtune voltage. Consequently, selecting a tuning curve near a maximum or minimum operating voltage of Vtune provides little flexibility in adjusting Vtune to compensate for PVT variations, leading to higher random and periodic jitter of the PLL.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a method of calibrating, by a calibration engine, a phase-locked loop (PLL) having one or more adjustable oscillators. The method includes entering a calibration mode of the PLL. The PLL is set to an initial state, thereby selecting one of the adjustable oscillators for calibration, an initial threshold window, and an initial tuning band of the selected adjustable oscillator. If the control signal of the selected adjustable oscillator is not within the initial threshold window, the calibration engine iteratively adjusts at least one of: (i) the selected tuning band of the selected adjustable oscillator, (ii) the selected adjustable oscillator, and (iii) the selected threshold window until the control signal of the selected adjustable oscillator is within the adjusted threshold window. If the control signal is within the threshold window, the one or more calibration settings of the PLL are stored in memory and used to set the PLL operation.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
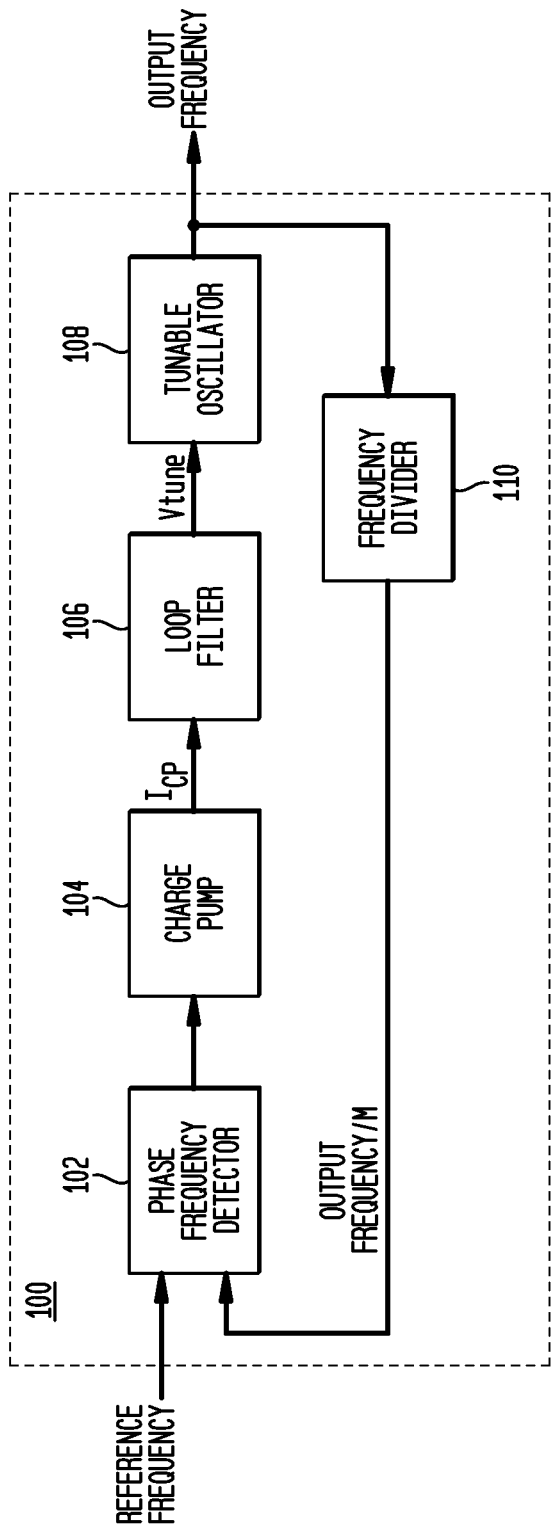
FIG. 1 shows a prior art exemplary circuit implementation of a phase-locked loop (PLL)
Figure 2:
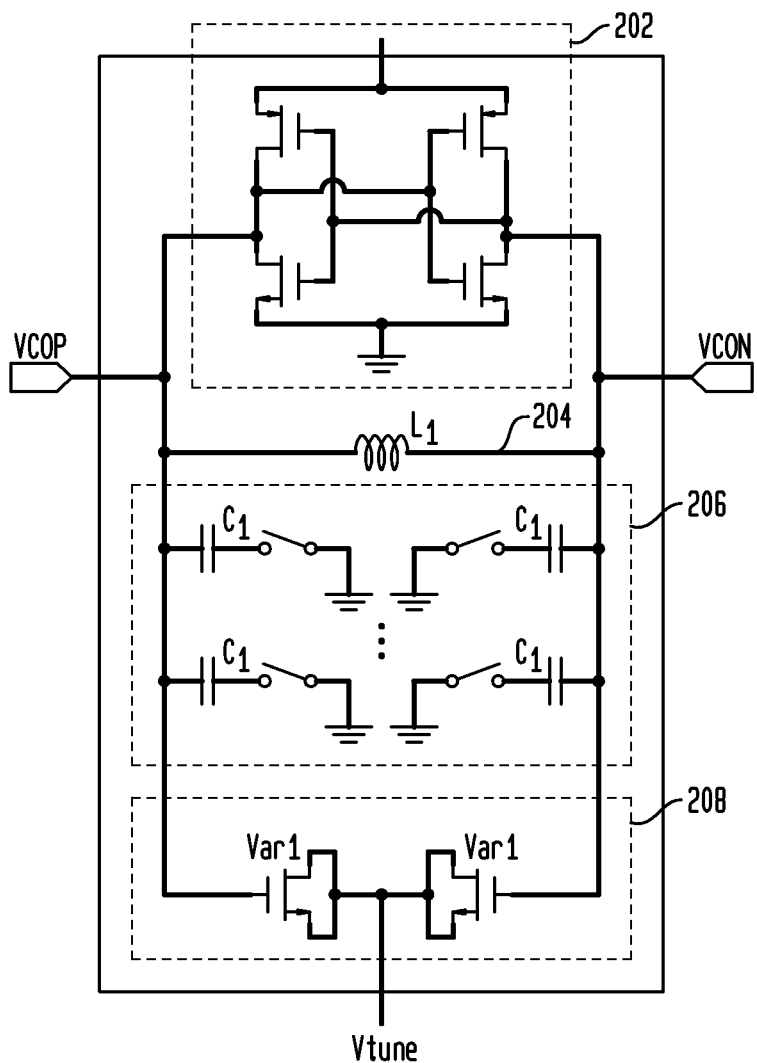
FIG. 2 shows a prior art exemplary circuit implementation of a single, wide-range inductive-capacitive (LC) voltage-controlled oscillator (VCO) of the PLL shown in FIG. 1.
Figure 3:
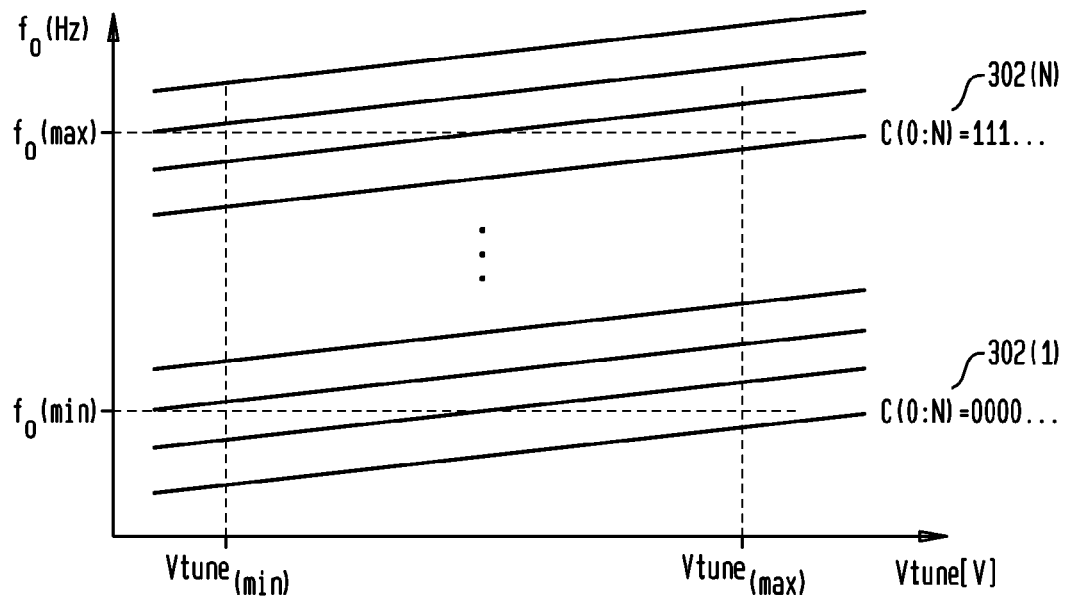
FIG. 3 shows an exemplary graph of one or more tuning curves on a plot of output frequency versus control voltage of the PLL of FIG. 1.
Figure 4:
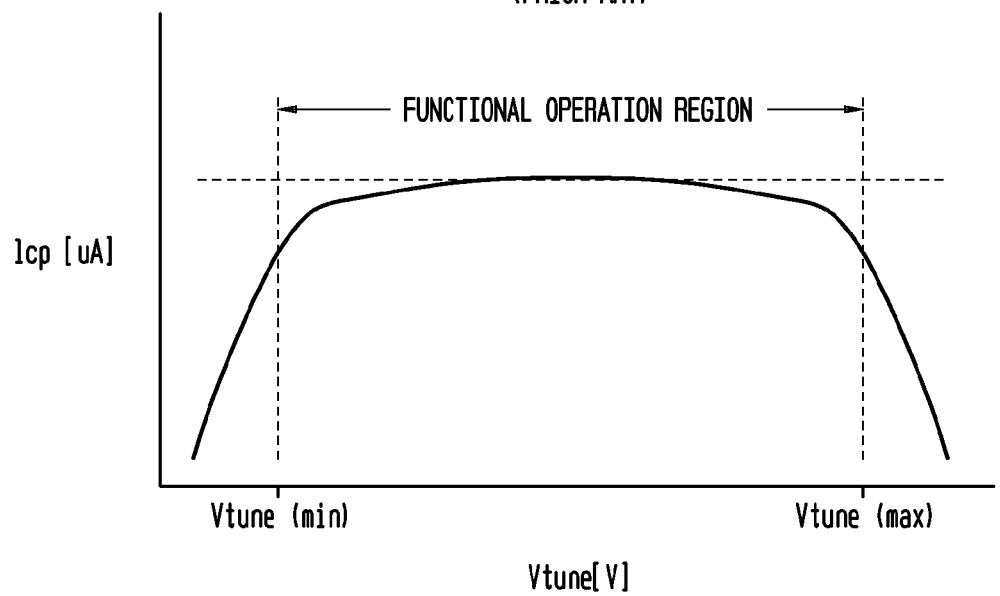
FIG. 4 shows an exemplary graph of the charge pump output current, $I_{CP}$, versus the control voltage, Vtune, of the PLL of FIG. 1.
Figure 5A:
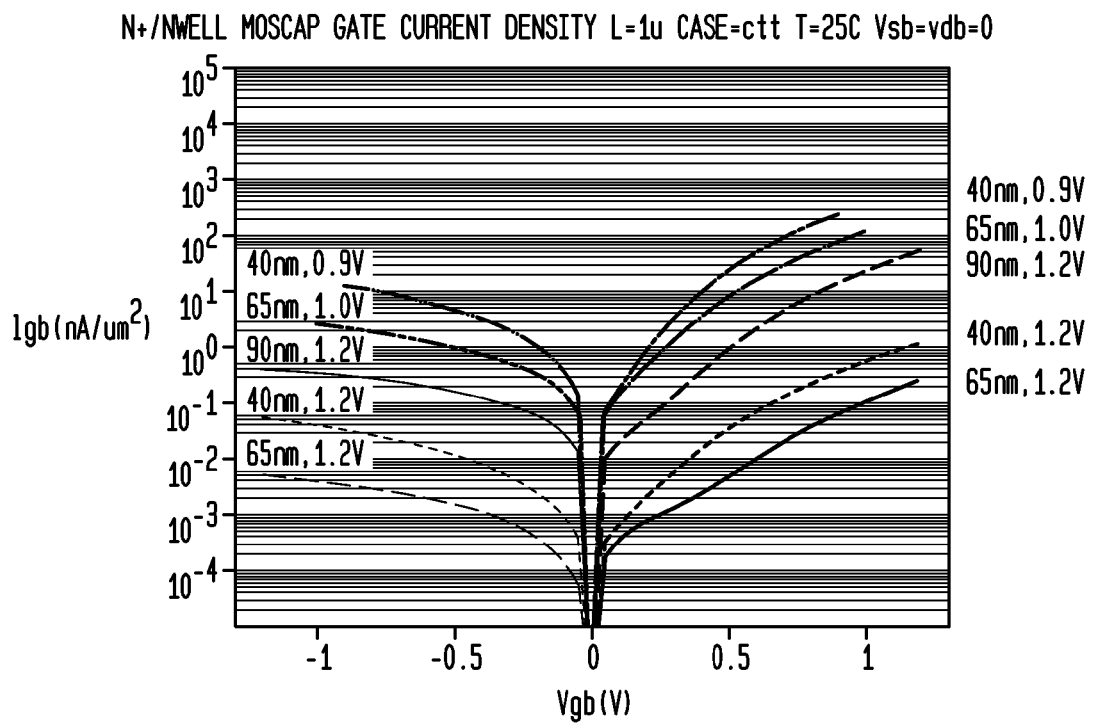
FIG. 5A shows an exemplary graph of the varactor gate current density, Igb, versus gate voltage, Vgb, of the VCO of FIG. 2.
Figure 5B:
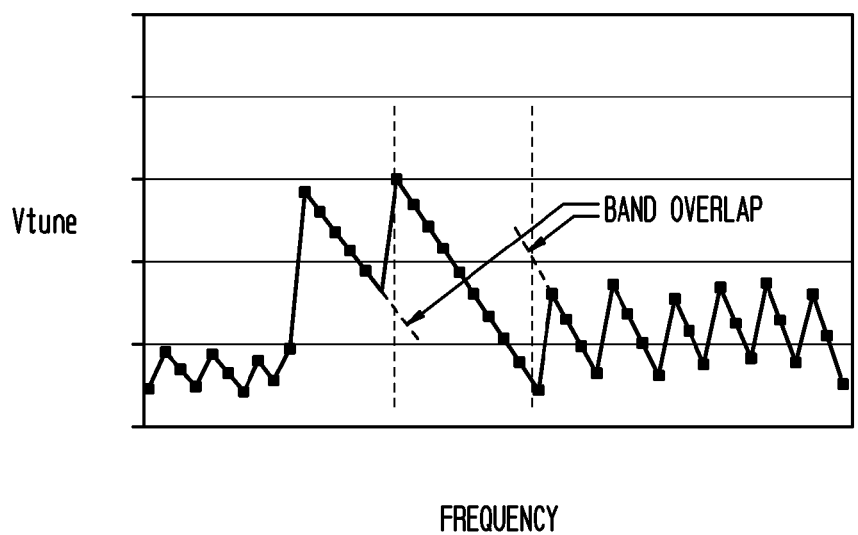
FIG. 5B shows an exemplary graph of control voltage versus PLL frequency and arbitrary frequency band selection of the PLL of FIG. in accordance with previous closed-loop calibration methods.

Described embodiments of the present invention provide closed loop calibration of a multiple voltage controlled oscillator (VCO) phase-locked loop (PLL) without opening the PLL's feedback loop to force external voltage on to the VCO's oscillation frequency control node (Vtune node) during calibration. Described embodiments align the PLL operating point to a target Vtune voltage by selecting a relative best VCO circuit and a relative best tuning band from multiple switched-capacitor LCVCOs. Described embodiments employ adaptive Vtune voltage thresholds that are generated and modified, if necessary, by a calibration engine of the PLL during calibration rather than employing preset thresholds that are fixed during calibration. The target Vtune voltage is programmable and set by register settings of the calibration engine. Described embodiments of the present invention provide PLL calibration for a relatively optimum PLL operating control voltage, Vtune, without decreasing the frequency range of the PLL. Described embodiments also provide improved process, voltage and temperature (PVT) performance by allowing for a Vtune value centered in the operating voltage threshold window, allowing greater flexibility to adjust Vtune either up or down to account for PVT variations.

Table 1 summarizes a list of acronyms employed throughout this specification as an aid to understanding the described embodiments of the present invention:

TABLE 1

| | |
|---|---|
| VCO | Voltage Controlled Oscillator |
| Pj | Periodic Jitter |
| PVT | Process, Voltage, Temperature |
| SERDES | serializer-deserializer |
| $V_{dd}$ | Positive supply voltage |
| Vth high | Upper threshold voltage |
| Kvco | control voltage frequency gain |
| IC | Integrated Circuit |
| $I_{CP}$ | Charge Pump output current |
| RF | Radio Frequency |
| PMOS | P-channel MOS |
| LCVCO | Inductive-Capacitive VCO |
| Rj | Random Jitter |
| PLL | Phase-Locked Loop |
| Vtune | VCO control voltage |
| $V_{ss}$ | Negative supply voltage/ground |
| Vth low | Lower threshold voltage |
| $\omega_{osc}$ | VCO oscillation frequency |
| SoC | System on Chip |

TABLE 1-continued

| | |
|---|---|
| Poly-gate | Polysilicon gate |
| CMOS | Complementary metal oxide semiconductor |
| NMOS | N-channel MOS |

The performance of, for example, high-speed SERDES devices might depend highly on the quality of the performance of a corresponding phase-locked loop (PLL) of the SERDES device. Embodiments of the present invention substantially improve performance of a PLL by allowing for PLL operation that exhibits relatively good operating margin to overcome significant PVT variation. Embodiments of the present invention might be beneficially employed in 40 nm CMOS technology devices, for example SERDES devices operating in the 8.5 Gbps to 14.025 Gbps speeds, and 28 nm CMOS technology devices, for example SERDES devices operating at 17 Gbps to 28 Gbps.

The inventors herein recognize that significant leakage current from the Vtune node might lead to increased periodic jitter in the PLL output. Additionally, a problem with deep submicron polysilicon gate (poly-gate) CMOS technology is that the gate leakage current from RF varactors of the PLL increases as CMOS geometry gets smaller (e.g., 40 nm). The inventors, in recognition of these and other problems of previous PLL calibration methods, describe herein embodiments that adjust PLL operation to where the control voltage, Vtune, is centered in its operational voltage range to improve the overall PVT performance of the PLL and also to achieve a large frequency range of operation.

Figure 6:
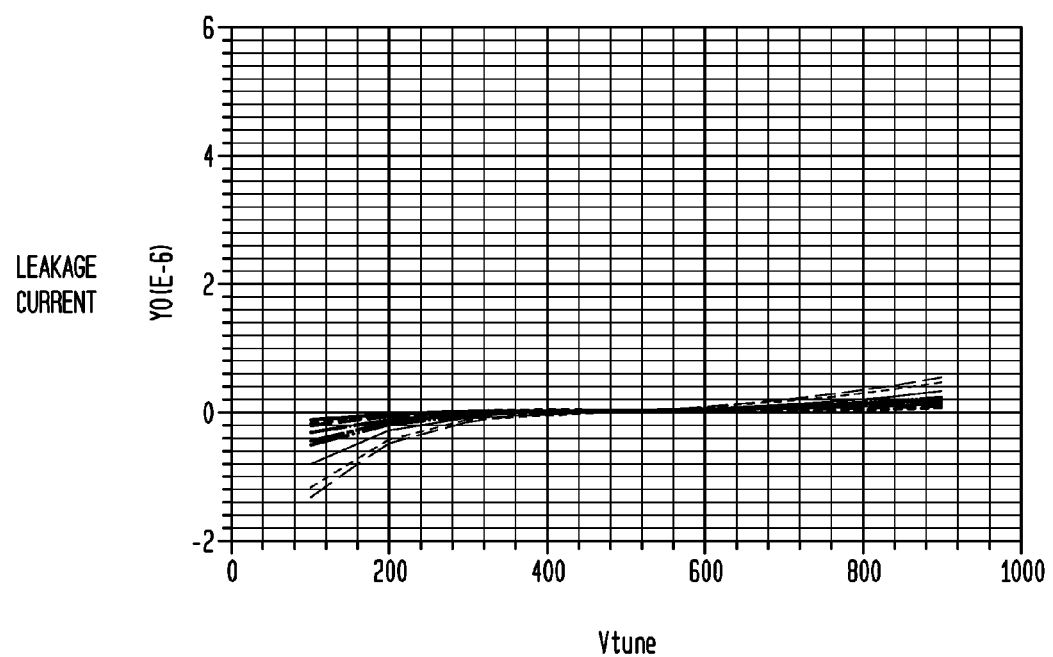
FIG. 6 shows an exemplary graph of the varactor leakage current versus Vtune voltage a PLL in accordance with exemplary embodiments of the present invention.

As shown in FIG. 6, gate leakage current switches signs and is thus at zero valued at some Vtune voltage. In described embodiments of the present invention, the VCO employed might have substantially zero leakage current at a Vtune voltage of 0.45V, such as shown in FIG. 6. In described embodiments, the PLL operating point for the Vtune voltage might beneficially be set to be approximately 0.45V to minimize leakage current and, correspondingly, periodic jitter (Pj) of the PLL. Vtune might also be a programmable voltage allowing for adjustment to also attempt to improve random jitter (Rj) and PVT performance of the PLL.

A PLL operating in accordance with embodiments of the present invention enables wide tuning-range and achieves stable performance over process, voltage and temperature (PVT) variations. Embodiments of the present invention might employ PLLs having multiple LCVCOs, wherein the multiple VCOs provide for multiple oscillation frequency-bands. For example, the adaptive VCO calibration method described herein might be employed in PLL circuits having one or more VCOs, such as the LCVCO employing up to N VCOs such as described in U.S. patent application Ser. No. 13/179,653 filed Jul. 11, 2011, which is incorporated herein by reference.

In a circuit having multiple VCOs, each VCO might be employed to generate a particular output frequency. For example, a first VCO might be a relatively lower frequency ("low-gear") VCO, while subsequent VCOs might be relatively higher frequency VCOs. For example, a low-gear VCO for SERDES applications might be configured for providing a targeted central frequency having a value ranging from approximately 8 GHz to approximately 10.5 GHz. A next, higher-gear VCO might be configured for providing a targeted central frequency having a value ranging from approximately 10.5 GHz to approximately 13 GHz, and so on. One VCO might be powered at a given time. For example, when the targeted central frequency sought is a value within the range of approximately 8 GHz to approximately 10.5 GHz, the low-gear VCO might be powered on and active, while subsequent higher frequency VCOs are not powered on and are inactive.

Figure 7:
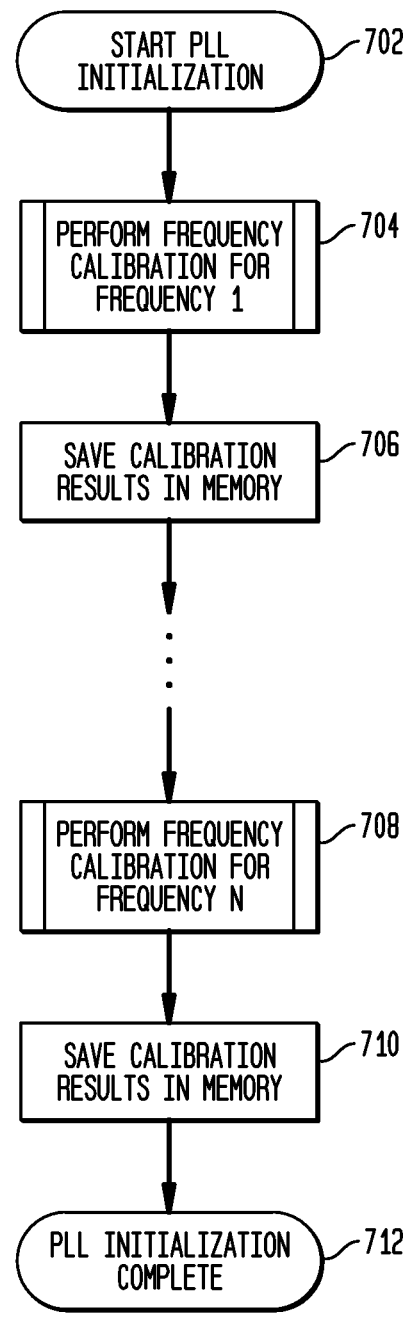
FIG. 7 shows a flow diagram of a PLL initialization process in accordance with exemplary embodiments of the present invention.

To configure the various VCOs of the PLL, embodiments of the present invention might employ a calibration method such as described herein with respect to FIG. 7. FIG. 7 shows a flow diagram of PLL initialization process 700. At step 702, the initialization process is started, for example, at first startup of the PLL circuit, or when the PLL circuit is reset, for example by control software of an SoC employing the PLL circuit. At step 704, calibration is performed for a first target frequency of the PLL. The PLL might be employed to synthesize many different target frequencies to support, for example, multiple SERDES standards, for example, 10.3125 GHz for 10 G Ethernet, 14.025 GHz for 16 G Fibre Channel, 28.05 GHz for 32 G Fibre Channel, and so on. As will be described herein, the settings for each target frequency might be calibrated and stored for future quick start-up and frequency change of the PLL. The calibration process is described in greater detail subsequently with regard to FIG. 9 below. In some embodiments of the present invention, the target frequencies might be generated by one or more VCOs of the PLL. At step 706, once the first target frequency is calibrated, the corresponding control setting values such as the Vtune voltage and other control values, are transferred to a memory, such as settings memory 1656 shown in FIG. 6. Calibration continues for up to the Nth target frequency of the PLL at steps 708 and 710. Once the N target frequencies are calibrated and the corresponding control values saved in memory, PLL initialization process 700 completes at step 712.

Figure 8:
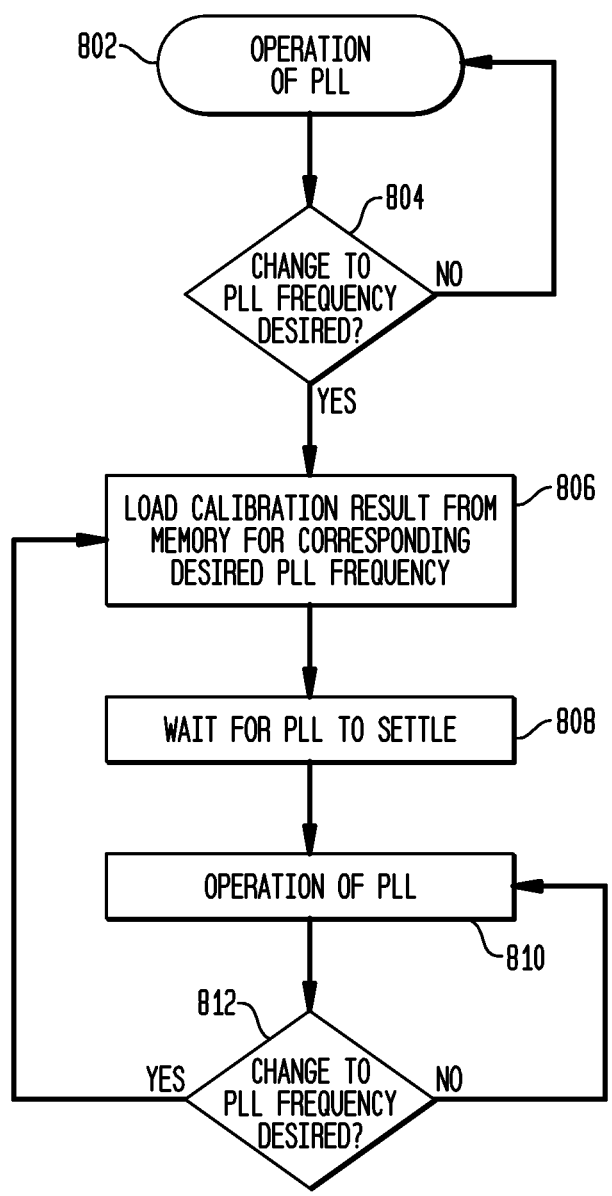
FIG. 8 shows a flow diagram of a PLL operation process in accordance with exemplary embodiments of the present invention.

FIG. 8 shows a flow diagram of PLL operation process 800. At step 802, the PLL circuit operates such that one or more of the N VCOs are generating an output frequency of the PLL for use by one or more other functional blocks of the SoC. Process 800 remains at step 802 for operation of the PLL until, at step 804, a change to the PLL frequency is desired. If a frequency change is desired, at step 806, the PLL loads one or more calibration setting values from memory into the PLL setting registers to change the PLL output frequency. For example, one or more setting values might be loaded from memory 1656 into one or more of registers 1642-1654 of calibration engine 1640 shown in FIG. 16. At step 808, a predetermined time elapses to allow for the PLL to settle at a steady-state output frequency before the PLL resumes normal operation at step 810 where the output frequency of the PLL is employed by one or more other functional blocks of the SoC. Process 800 remains at step 810 for operation of the PLL until, at step 812, a change to the PLL frequency is desired, and so process 800 returns to step 806 to load one or more calibration setting values from memory into the PLL setting registers to change the PLL output frequency.

Figure 9:
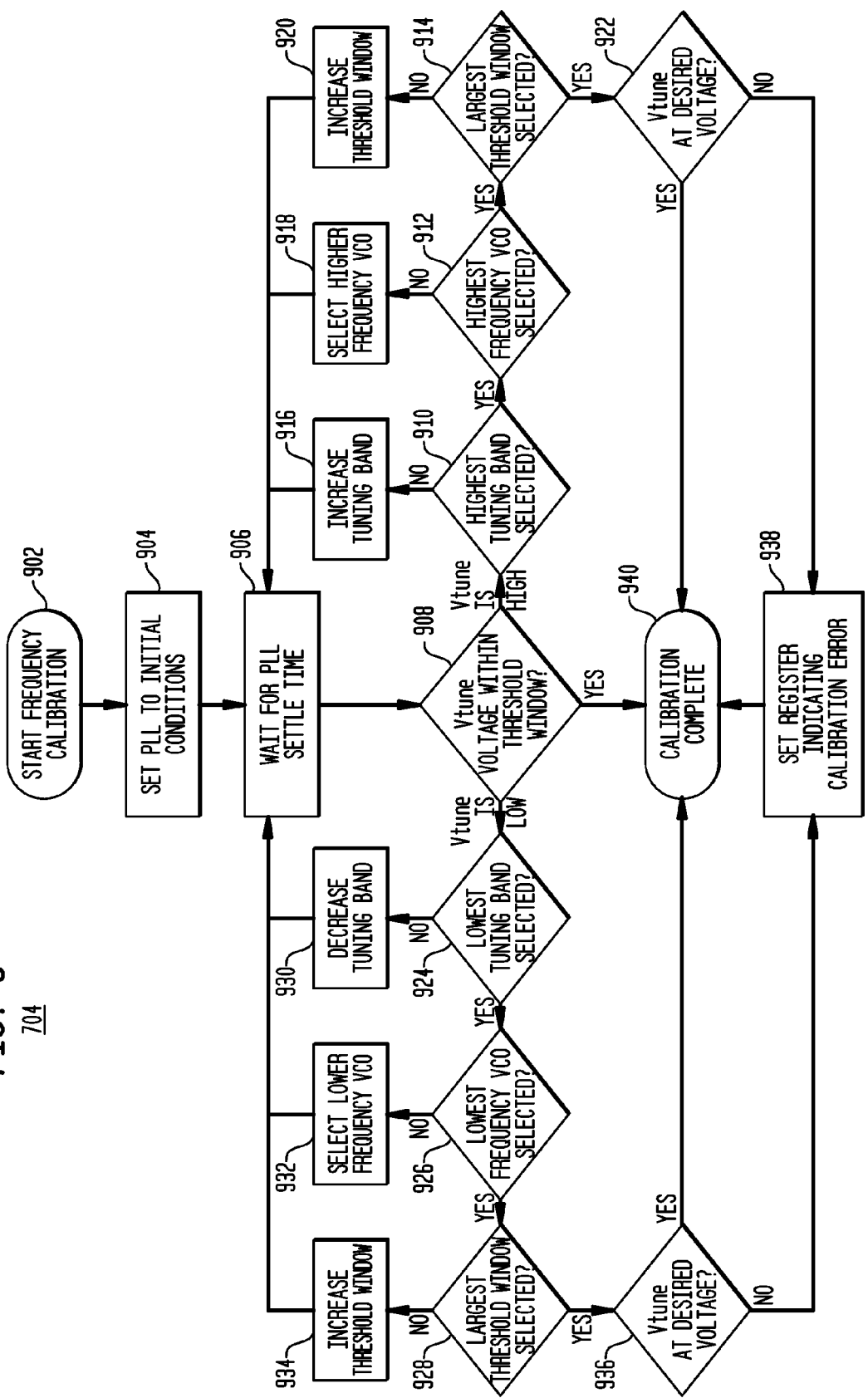
FIG. 9 shows a flow diagram of a PLL calibration process in accordance with exemplary embodiments of the present invention.

FIG. 9 shows a flow diagram of PLL frequency calibration process 704 of FIG. 7. Calibration process 704 might typically be performed by a calibration engine (e.g., calibration engine 1640 of FIG. 16 as described subsequently) that is coupled to the PLL. At step 902, frequency calibration is started for at least one of the VCOs of the PLL. For example, frequency calibration process 704 might be performed during PLL initialization process 700. At step 904, the PLL might be set to a predetermined initial condition, for example, by loading default values into one or more of registers 1642-1654 of calibration engine 1640. The default values might be predetermined to set the Vtune voltage to a desired level, or for the PLL to generate a desired output frequency, and stored in the calibration memory. At step 906, calibration process 704 waits a predetermined time to allow for the PLL to settle at a steady-state output frequency before checking whether Vtune is at the desired target voltage at step 908. If, at step 908, the Vtune voltage is above an upper voltage threshold, calibration process 704 continues to step 910.

Figure 16:
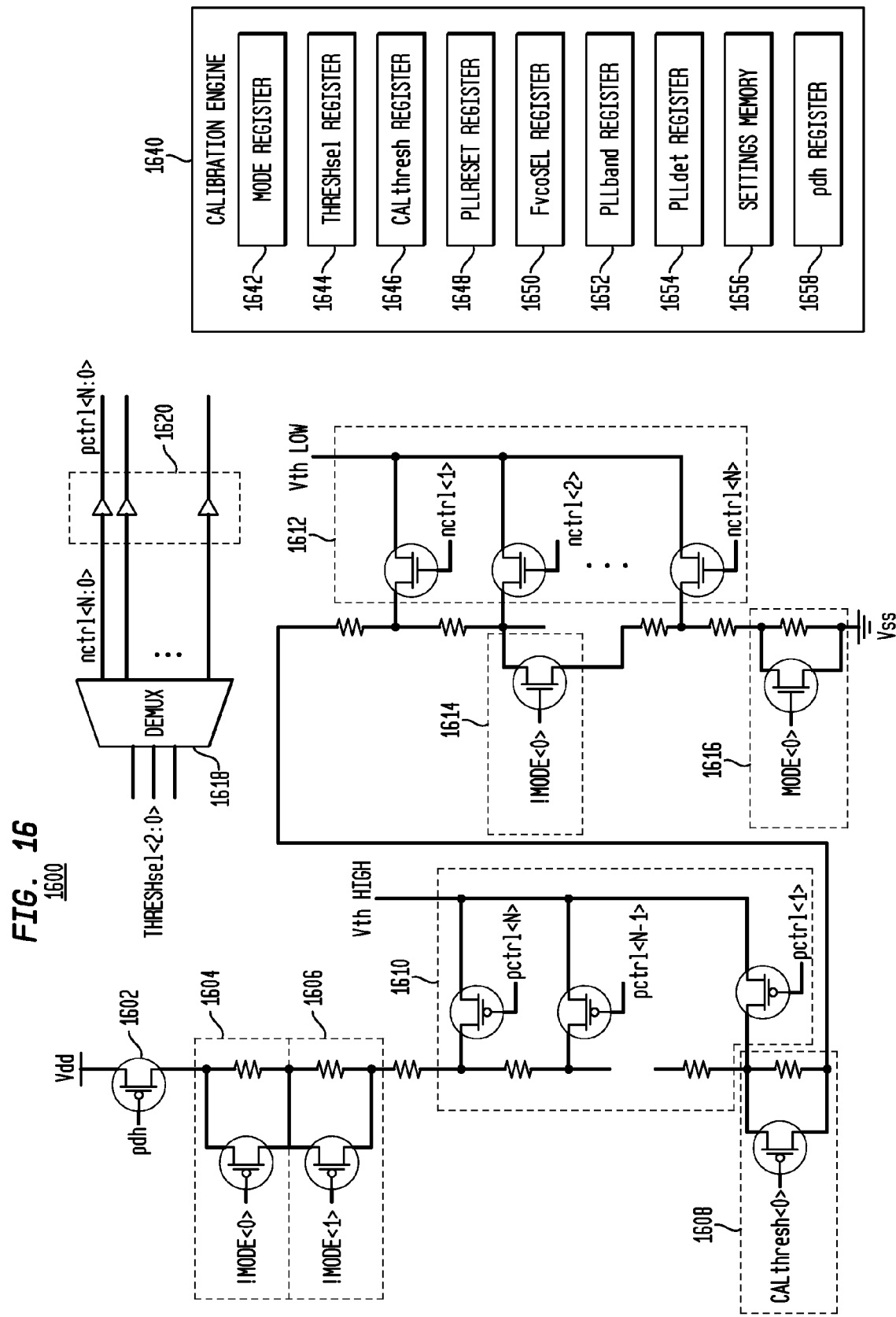
FIG. 16 shows an exemplary schematic diagram of a calibration circuit of the PLL in accordance with embodiments of the present invention.

At step 910, the calibration engine (e.g., calibration engine 1640 of FIG. 16) determines whether the highest tuning band of a given VCO is selected, for example by settings of the switched capacitor bank of the VCO (e.g., PLLband register 1652 of FIG. 16). If, at step 910, the highest tuning band of the VCO is not selected, at step 916, a next higher tuning band is selected, and at step 906, calibration process 704 waits a predetermined time to allow for the PLL to settle at a steady-state output frequency before checking whether Vtune is at the desired target voltage at step 908. If, at step 910, the highest tuning band of the VCO is selected, at step 912, calibration engine 1640 determines whether the highest frequency VCO of the N VCOs of the PLL is selected (e.g., FvcoSEL register 1650 of FIG. 16). If, at step 912, the highest frequency VCO is not selected, at step 918, a next higher frequency VCO is selected, and at step 906, calibration process 704 waits a predetermined time to allow for the PLL to settle at a steady-state output frequency before checking whether Vtune is at the desired target voltage at step 908.

If, at step 912, the highest frequency VCO of the multi-VCO PLL is selected, at step 914, calibration engine 1640 determines whether the largest voltage threshold window is selected (e.g., THRESHsel register 1644, MODE register 1642 and CALthresh register 1646). If, at step 914, the largest voltage threshold window is not selected, at step 920, a next larger voltage threshold window is selected, and at step 906, calibration process 704 waits a predetermined time to allow for the PLL to settle at a steady-state output frequency before checking whether Vtune is within the increased voltage threshold window at step 908. Since the Vtune voltage is programmable, the Vtune voltage is adjustable within the voltage threshold window to achieve the desired output frequency, for example at step 904 when the PLL is initialized.

Figure 18:
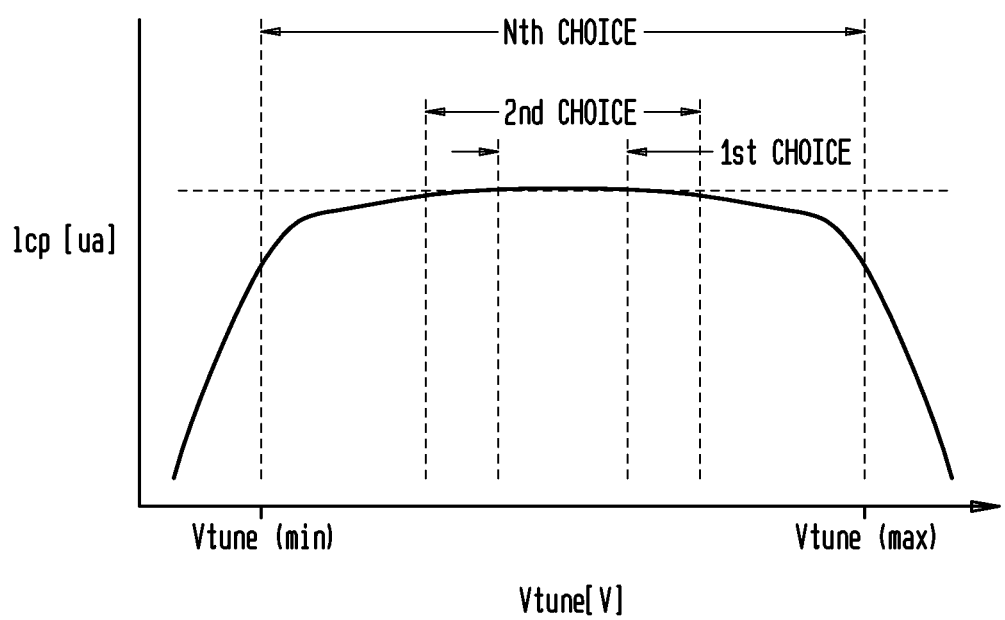
FIG. 18 shows an exemplary graph of the charge pump output current, $I_{CP}$, versus the control voltage, Vtune, of the PLL in accordance with embodiments of the present invention.

FIG. 18 shows an exemplary graph of the charge pump output current, ICP, versus the control voltage, Vtune, of the PLL in accordance with embodiments of the present invention. As shown in FIG. 18, increasing the threshold window size allows for a Vtune voltage that is farther away from the substantially zero-leakage current voltage of the VCO as noted above with regard to FIG. 6. As shown in FIG. 18, the calibration thresholds are adaptively controlled by a calibration engine. The center of calibration thresholds are also programmable, and can be used to achieve multiple optimization goals such as operating at an optimized condition for loop filter cap voltage biasing; an optimized condition for VCO varactor voltage biasing, or an optimized condition for linear charge pump current.

Referring back to FIG. 9, if, at step 914, the largest voltage threshold window is selected, but at step 922 Vtune cannot be programmed to a voltage within the threshold window to achieve the desired output frequency of the PLL, at step 938 the PLL cannot be calibrated to generate the desired output frequency, and calibration engine 1640 indicates an error condition. If, at step 922, the Vtune voltage is within the increased voltage threshold window, then, at step 940 calibration process 704 completes.

If, at step 908, the Vtune voltage is below a lower voltage threshold, calibration process 704 continues to step 924. At step 924, the calibration engine (e.g., calibration engine 1640 of FIG. 16) determines whether the lowest tuning band of a given VCO is selected, for example by settings of the switched capacitor bank of the VCO. If, at step 924, the lowest tuning band of the VCO is not selected, at step 930, a next lower tuning band is selected. At step 906, calibration process 704 waits a predetermined time to allow for the PLL to settle at a steady-state output frequency before checking whether Vtune is at the desired target voltage at step 908. If, at step 924, the lowest tuning band of the VCO is selected, at step 926, calibration engine 1640 determines whether the lowest frequency VCO of the N VCOs of the PLL is selected. If, at step 926, the lowest frequency VCO is not selected, at step 932, a next lower frequency VCO of the PLL is selected, and at step 906, calibration process 704 waits a predetermined time to allow for the PLL to settle at a steady-state output frequency before checking whether Vtune is at the desired target voltage at step 908.

If, at step 926, the lowest frequency VCO of the multi-VCO PLL is selected, at step 928, calibration engine 1640 determines whether the largest voltage threshold window is selected. If, at step 928, the largest voltage threshold window is not selected, at step 934, a next larger voltage threshold window is selected. At step 906, calibration process 704 waits a predetermined time to allow for the PLL to settle at a steady-state output frequency before checking whether Vtune is within the increased voltage threshold window at step 908. Since the Vtune voltage is programmable, the Vtune voltage is adjustable within the voltage threshold window to achieve the desired output frequency, for example, when the PLL is initialized at step 904. Increasing the threshold window size allows for a Vtune voltage that is farther away from the substantially zero-leakage current voltage of the VCO as noted above with regard to FIG. 6. If, at step 928, the largest voltage threshold window is selected, but at step 936 Vtune cannot be programmed to a voltage within the threshold window to achieve the desired output frequency of the PLL, the process advances to step 938. At step 938, since the PLL cannot be calibrated to generate the desired output frequency, an error condition is generated (e.g., calibration engine 1640 indicates an error condition). If, at step 936, the Vtune voltage is within the increased voltage threshold window, calibration process 704 completes at step 940.

Calibration process 704 might iteratively repeat steps 906-924 depending on a number of adjustments to the PLL settings required to bring the Vtune voltage within the voltage threshold window. If, at step 908, the Vtune voltage is within both the upper voltage threshold and the lower voltage threshold, calibration process 704 continues to step 940. At step 940, calibration process 704 completes.

Table 2 shows an exemplary table of control registers that might be employed by calibration engine 1640 in accordance with embodiments of the present invention.

TABLE 2

| Register Name | Register Function | Register Values |
|---|---|---|
| PLLRESET | Resets the PLL and triggers PLL calibration | 0 = normal operation of PLL<br>1 = reset PLL |
| FvcoSEL | VCO frequency range selection | 0 = slowest VCO<br>N = fastest VCO |
| PLLband | PLL tuning band selection | 0 = slowest VCO tuning range<br>M-1 = fastest VCO tuning range |
| CALthresh | PLL calibration comparator threshold window adjustment | 0 = wider target window<br>1 = narrower target window |
| THRESHsel | VCO calibration threshold window selection | 0 = smallest calibration threshold window<br>X = largest calibration threshold window |
| MODE | Programmable target center voltage for Vtune for PLL calibration | 0 = 1st programmable target center Vtune voltage<br>Y = Yth programmable target center Vtune voltage |

TABLE 2-continued

| Register Name | Register Function | Register Values |
|---|---|---|
| PLLdet | PLL calibration detection indicator | 00 = Vtune is in range<br>01 = Vtune is too low<br>10 = Vtune is too high<br>11 = n/a |

For example, the control register values shown in Table 2 might be employed to select settings of the PLL by control software operating on a microprocessor associated with an SoC employing the PLL circuit. The control software might interact with the control registers to determine whether the PLL circuit is operating as desired during calibration (for example by reading the PLLdet register), and to select the tuning band and Vtune voltage (for example by setting the PLLband register and the MODE register).

Figure 10:
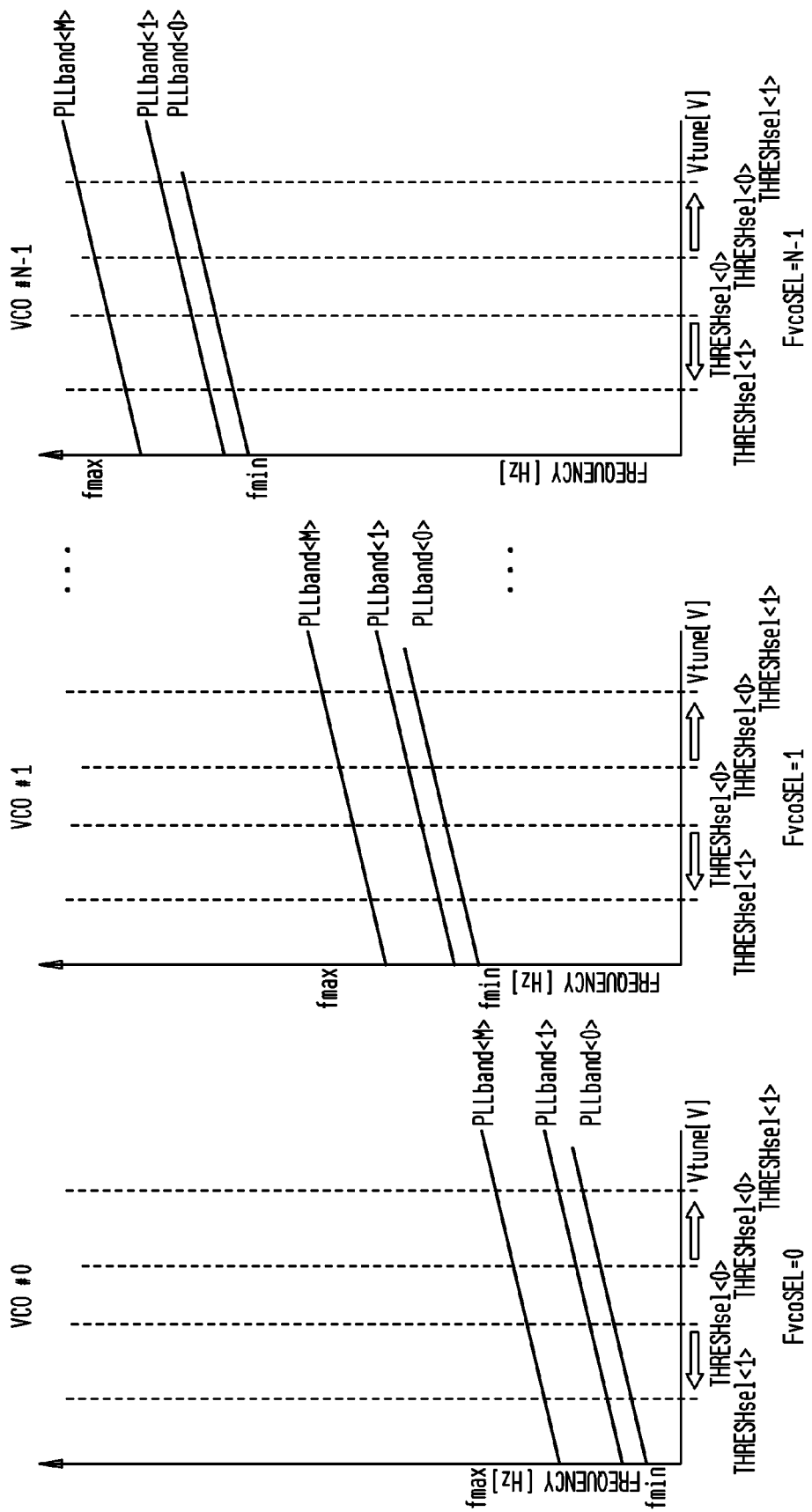
FIG. 10 shows exemplary graphs of tuning curves on a plot of output frequency versus control voltage of the PLL calibration process of FIG. 9.

FIG. 10 shows exemplary tuning bands and voltage threshold windows for N VCOs of a multi-VCO PLL employing calibration process 704. As shown in FIG. 10, a first of the N VCOs, shown as VCO #0, might be employed to generate a relatively lower output frequency ("low-gear"), and each subsequent VCO, shown as VCO #1 through VCO #N-1, might be employed to generate relatively higher output frequencies. Each of the N VCOs might be selected by a register setting of calibration engine 1640, for example, the value of an FvcoSEL register. Each of VCOs #0 through N-1 have M tuning bands, indicated as PLLband<0> through PLLband<M>, where PLLband<0> is the lowest frequency tuning band, and PLLband<M> is the highest frequency tuning band. Each of VCOs 0-N also employs two Vtune voltage threshold windows, each window having an upper and lower voltage threshold, shown as THRESHsel<0> and THRESHsel<1>.

Figure 11:
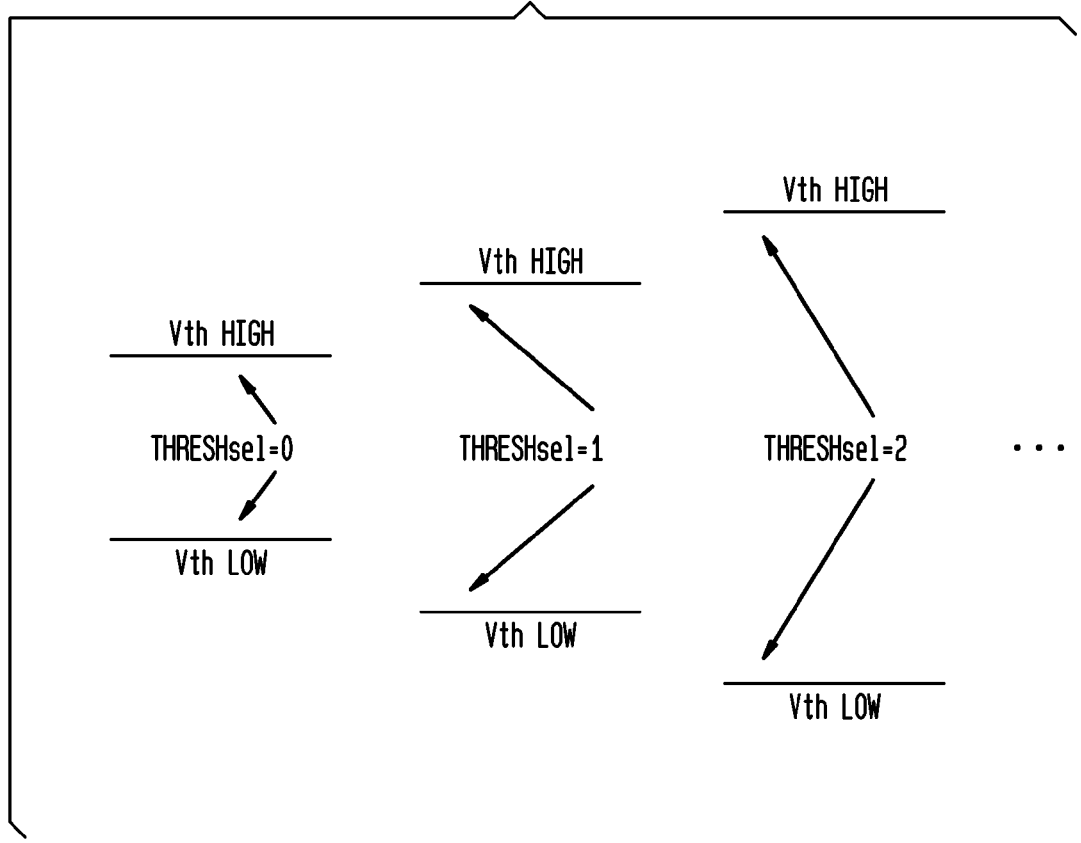
FIG. 11 shows an exemplary graph of one or more tuning threshold windows of the PLL calibration process of FIG. 9.
Figure 12A:
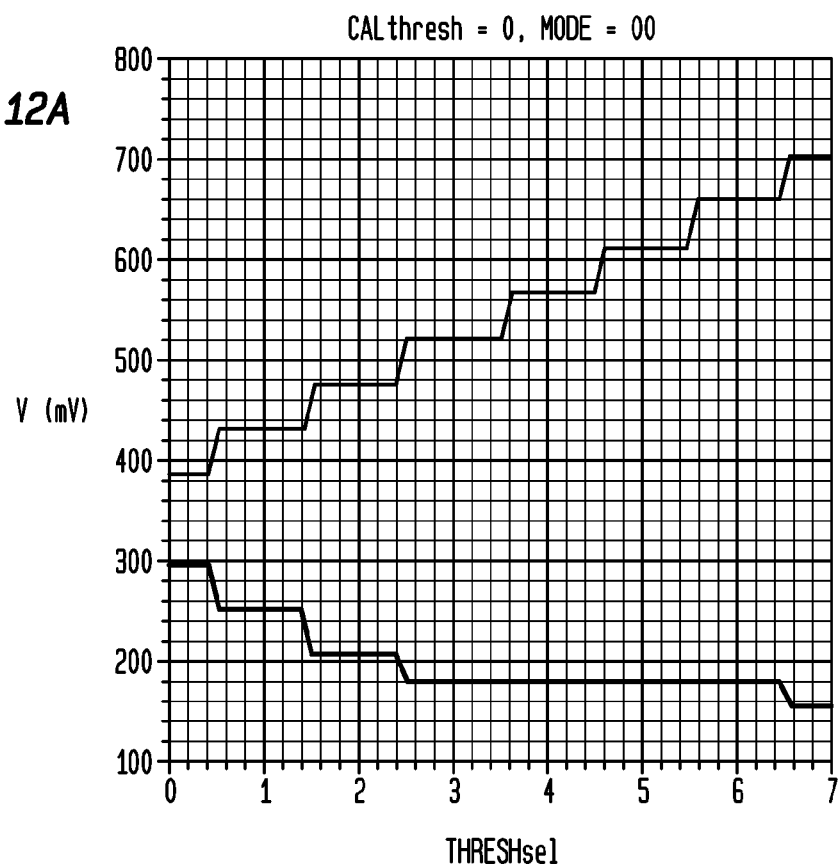
FIG. 12A shows an exemplary graph of the tuning voltage threshold window versus the value of the THRESHsel register in a first mode of operation of the PLL and when the CALthresh register is cleared, in accordance with exemplary embodiments of the present invention.
Figure 12B:
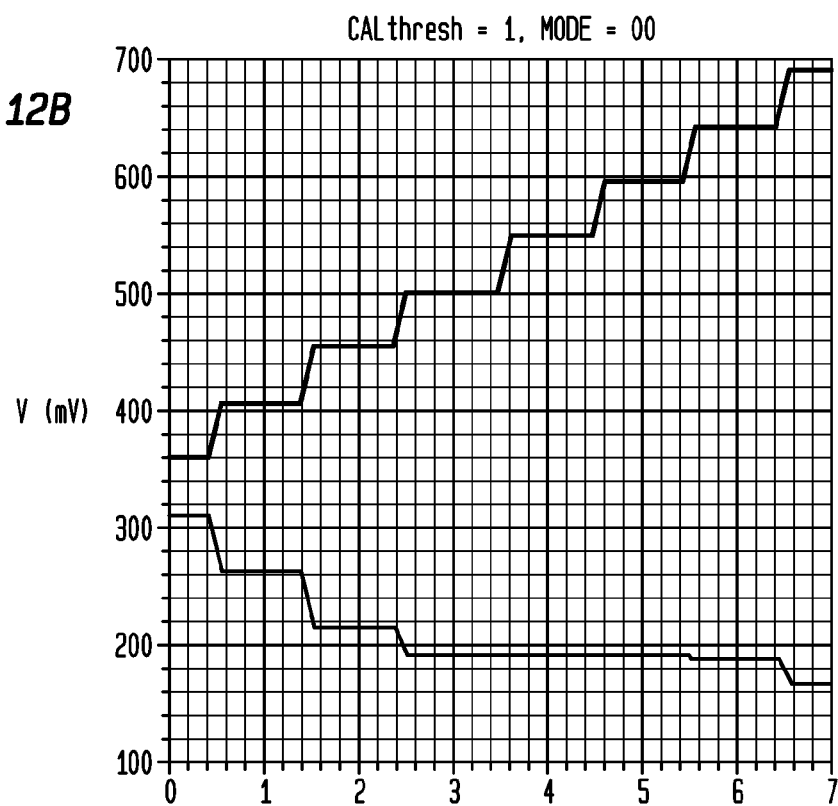
FIG. 12B shows an exemplary graph of the tuning voltage threshold window versus the value of the THRESHsel register in a first mode of operation of the PLL and when the CALthresh register is set, in accordance with exemplary embodiments of the present invention.
Figure 13A:
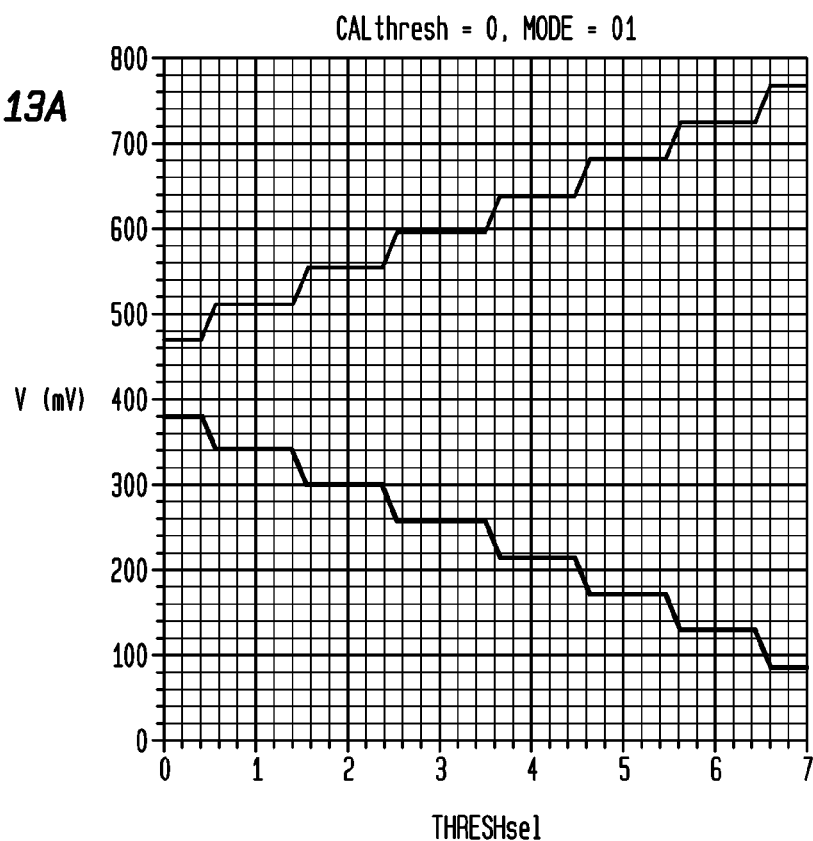
FIG. 13A shows an exemplary graph of the tuning voltage threshold window versus the value of the THRESHsel register in a second mode of operation of the PLL and when the CALthresh register is cleared, in accordance with exemplary embodiments of the present invention.
Figure 13B:
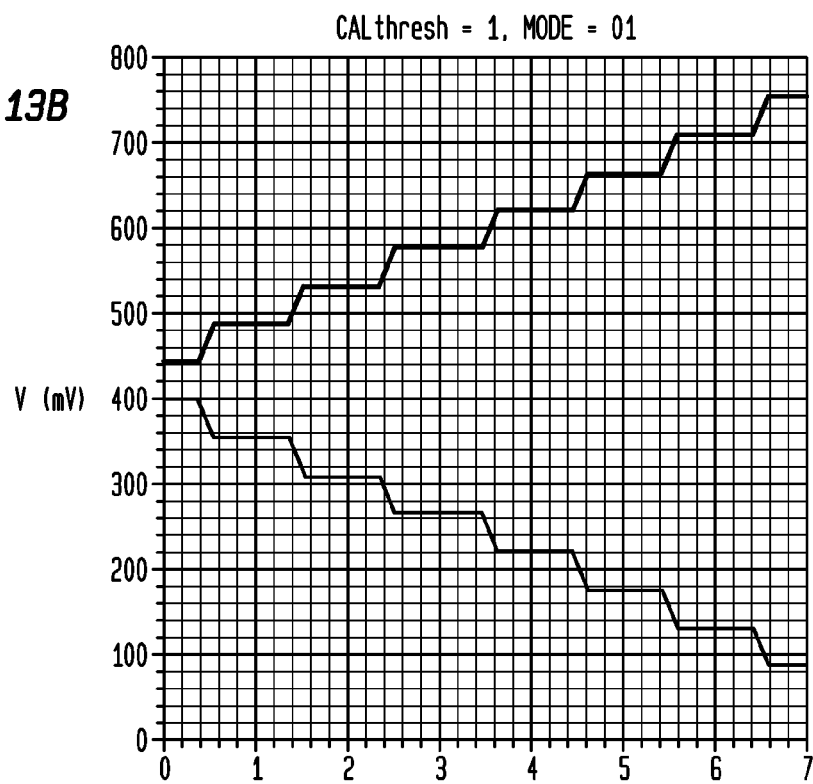
FIG. 13B shows an exemplary graph of the tuning voltage threshold window versus the value of the THRESHsel register in a second mode of operation of the PLL and when the CALthresh register is set, in accordance with exemplary embodiments of the present invention.
Figure 14A:
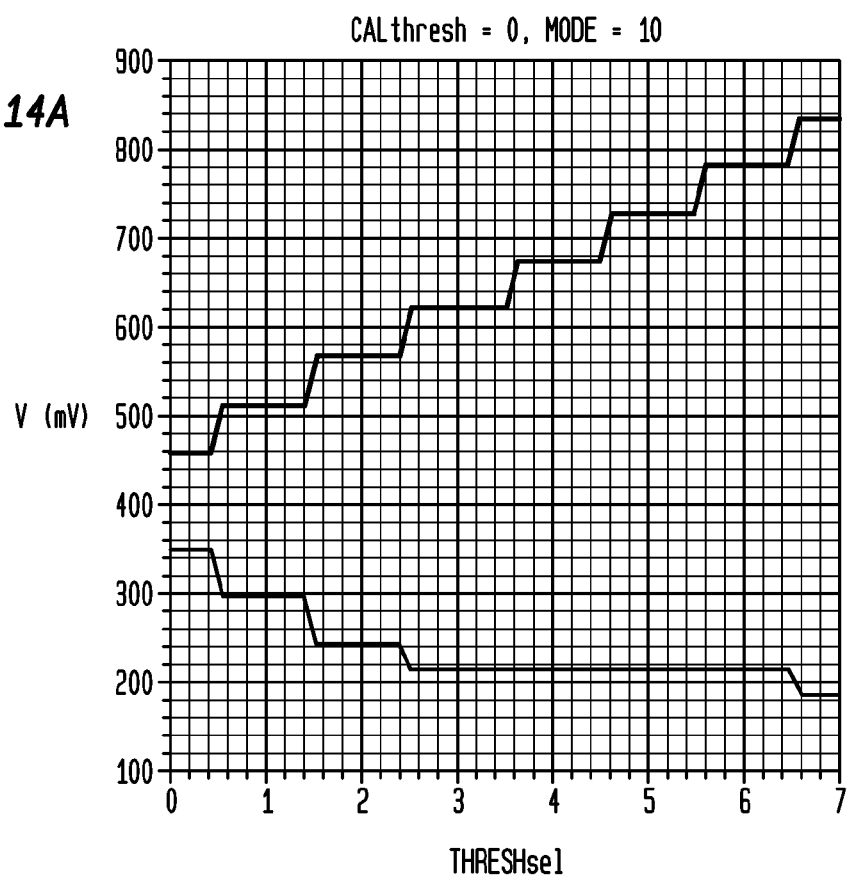
FIG. 14A shows an exemplary graph of the tuning voltage threshold window versus the value of the THRESHsel register in a third mode of operation of the PLL and when the CALthresh register is cleared, in accordance with exemplary embodiments of the present invention.
Figure 14B:
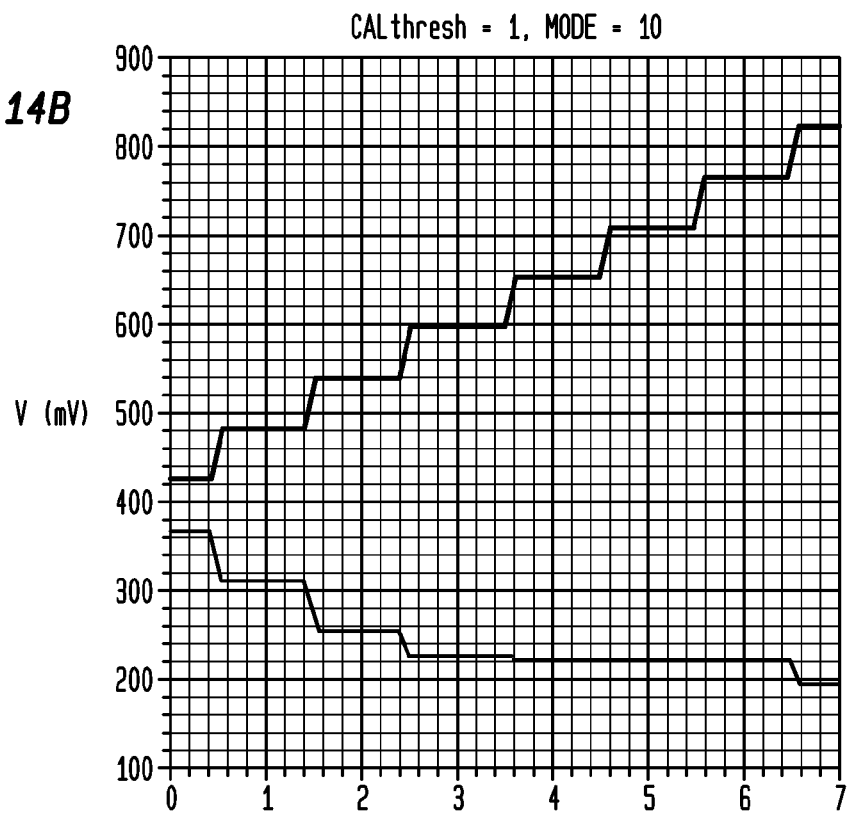
FIG. 14B shows an exemplary graph of the tuning voltage threshold window versus the value of the THRESHsel register in a third mode of operation of the PLL and when the CALthresh register is set, in accordance with exemplary embodiments of the present invention.
Figure 15A:
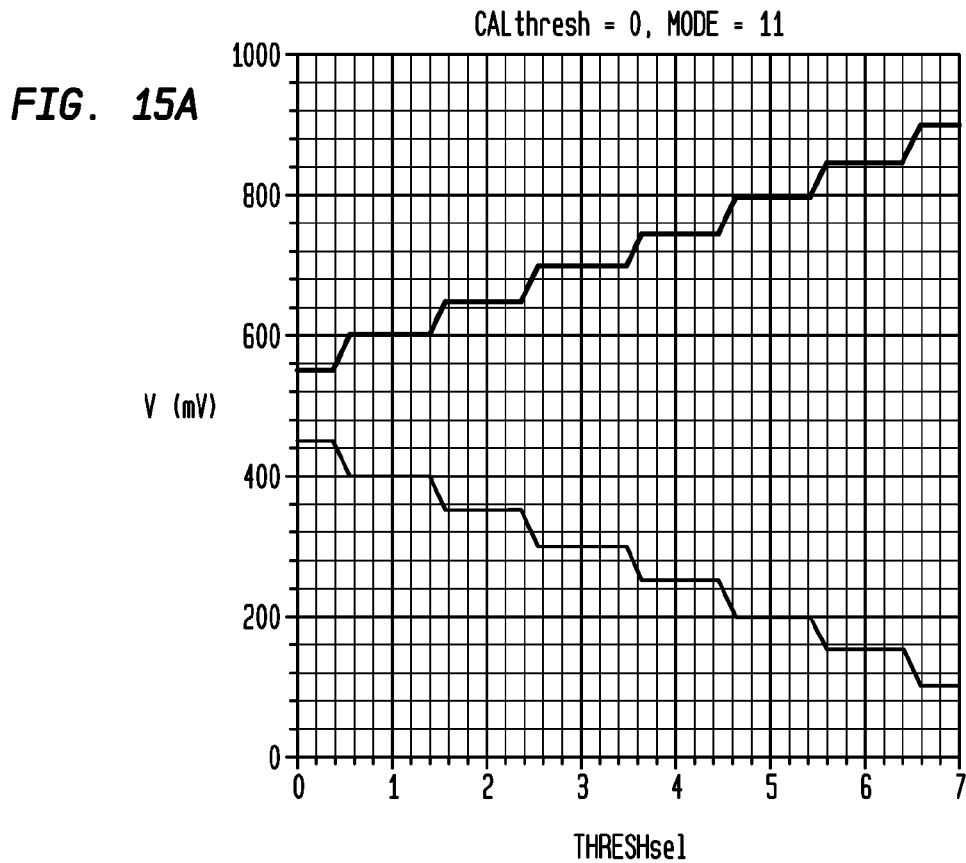
FIG. 15A shows an exemplary graph of the tuning voltage threshold window versus the value of the THRESHsel register in a fourth mode of operation of the PLL and when the CALthresh register is cleared, in accordance with exemplary embodiments of the present invention.
Figure 15B:
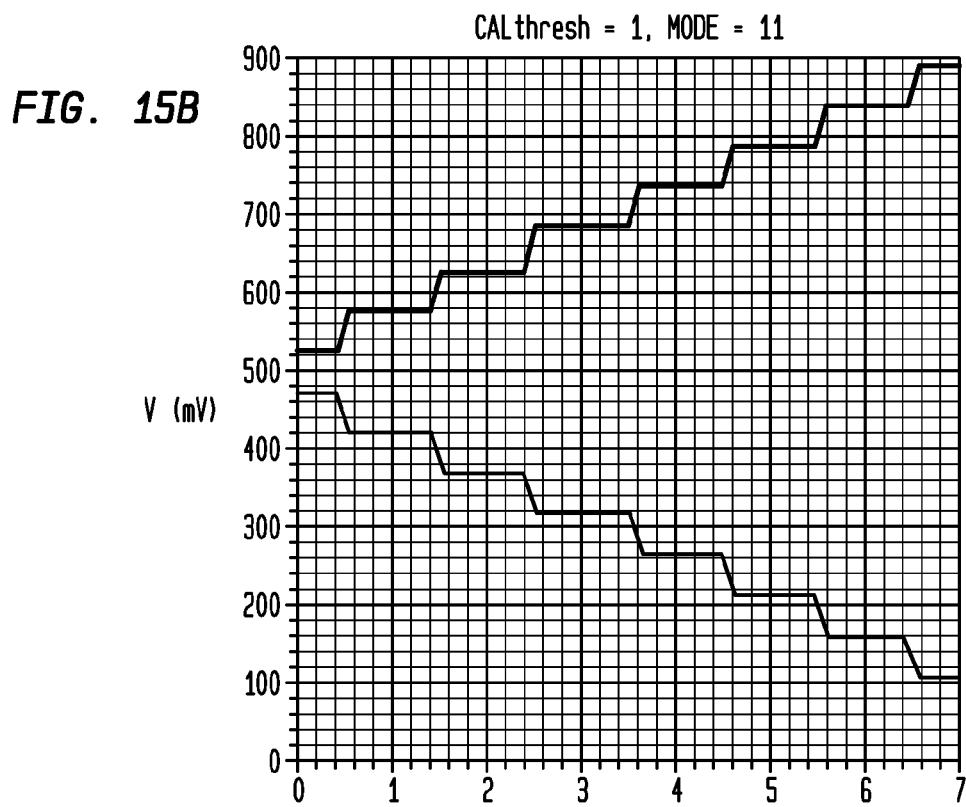
FIG. 15B shows an exemplary graph of the tuning voltage threshold window versus the value of the THRESHsel register in a fourth mode of operation of the PLL and when the CALthresh register is set, in accordance with exemplary embodiments of the present invention.

Although shown in FIG. 10 as employing two threshold window sizes, embodiments of the present invention are not so limited, and any number of threshold window sizes might be employed. As shown in FIG. 10, a first voltage threshold window (e.g., THRESHsel<0>) might be narrower than subsequent voltage threshold windows (e.g., THRESHsel<1>), to attempt to keep the Vtune voltage as close to the substantially zero leakage current voltage (e.g., 0.45V) as shown in FIG. 6. For example, FIG. 11 shows an exemplary sequence of Vtune voltage threshold windows where the threshold window increases by shifting an upper voltage threshold (Vth high) and a lower voltage threshold (Vth low) based on the value of the THRESHsel register of calibration engine 1640.

FIGS. 12-15 show exemplary voltage threshold windows based on the various register settings of calibration engine 1640 in accordance with exemplary embodiments of the present invention. FIGS. 12-15 show plots of the voltage threshold window in mV versus the value of the THRESHsel register. As shown in FIGS. 12A and 12B, the MODE register is set to 00, corresponding to a first programmable center voltage for the Vtune threshold window. In some embodiments, the first programmable center voltage might be approximately 350 mV. As shown in FIG. 12A, when the CALthresh register is set to 0, a relatively wider Vtune voltage threshold window might be generated, while, as shown in FIG. 12B, when the CALthresh register is set to 1, a relatively narrower Vtune voltage threshold window might be generated. As shown in FIGS. 13A and 13B, the MODE register is set to 01, corresponding to a second programmable center voltage for the Vtune threshold window. In some embodiments, the second programmable center voltage might be approximately 425 mV. As shown in FIG. 13A, when the CALthresh register is set to 0, a relatively wider Vtune voltage threshold window might be generated, while, as shown in FIG. 13B, when the CALthresh register is set to 1, a relatively narrower Vtune voltage threshold window might be generated. As shown in FIG. 14A, the MODE register is set to 10, corresponding to a third programmable center voltage for the Vtune threshold window. In some embodiments, the third programmable center voltage might be approximately 400 mV. As shown in FIG. 14A, when the CALthresh register is set to 0, a relatively wider Vtune voltage threshold window might be generated, while, as shown in FIG. 14B, when the CALthresh register is set to 1, a relatively narrower Vtune voltage threshold window might be generated. As shown in FIG. 15A, the MODE register is set to 11, corresponding to a fourth programmable center voltage for the Vtune threshold window. In some embodiments, the fourth programmable center voltage might be approximately 500 mV. As shown in FIG. 15A, when the CALthresh register is set to 0, a relatively wider Vtune voltage threshold window might be generated, while, as shown in FIG. 15B, when the CALthresh register is set to 1, a relatively narrower Vtune voltage threshold window might be generated.

FIG. 16 shows an exemplary schematic diagram of Vtune voltage threshold window circuit 1600. As shown in FIG. 16, threshold window circuit 1600 might generate an upper threshold voltage (Vth high) and a lower threshold voltage (Vth low) to form a threshold window based on the value of MODE register 1642, THRESHsel register 1644, CALthresh register 1646 and pdh register 1658. The pdh register 1658 might be employed to enable or disable power to threshold window circuit 1600 via transistor 1602. Transistor and resistor pairs 1604 and 1606 might be configurable to provide a selectably higher or lower voltage to transistor bank 1610 based on the value of MODE register 1642 (shown in FIG. 16 as inverted signals !MODE<0> for 1604 and !MODE<1> for 1606). As shown, each transistor and resistor pair 1604 and 1606 includes a resistor coupled between the drain and source of the transistor. When the transistor of 1604 is on, substantially the full Vdd voltage provided by transistor 1602 is provided to 1606. When the transistor of 1606 is on, substantially the voltage provided by 1604 is provided to transistor bank 1610. When both transistors 1604 and 1606 are on, the maximum voltage is provided to transistor bank 1610, and when both transistors 1604 and 1606 are off, a minimum voltage is provided to transistor bank 1610. Intermediate voltages are provided by turning on only one transistor, and the voltage depends on the value of each resistor of 1604 and 1606.

Transistor bank 1610 includes up to N transistors coupled drain-to-source between a corresponding resistor and the Vth high output signal. Each of the N transistors are controlled by a corresponding control signal, shown as control signals pctrl<1> through pctrl<N>. As shown below in Table 3, control signal pctrl is generated by Demux 1618 and inverters 1620 based on the value of THRESHsel register 1644. Depending on the value of pctrl, a corresponding one of the transistors of 1610 turns on to provide a voltage for the Vth high threshold level. As shown in FIG. 16, the transistor controlled by pctrl<1> provides the highest voltage value of Vth high, while the transistor controlled by pctrl<N> provides the lowest voltage value of Vth high, due to the number of corresponding resistors added in the path based on which transistor is turned on.

Transistor bank 1610 is coupled to transistor and resistor pair 1608. The transistor of 1608 is controlled by the value of CALthresh register 1646 to provide either a higher or lower voltage to transistor bank 1612, which selectably allows the lower threshold voltage (Vth low) generated by 1612 to be closer or farther from the voltage of the upper threshold voltage (Vth high), in effect narrowing or widening the threshold window. Transistor bank 1612 includes up to N transistors coupled drain-to-source between a corresponding resistor and the Vth low output signal node. Each of the N transistors are controlled by a corresponding control signal, shown as control signals nctrl<1> through nctrl<N>. As shown below in Table 3, control signal nctrl is generated by Demux 1618 based on the value of THRESHsel register 1644. Depending on the value of nctrl, a corresponding one of the transistors of 1612 is turned on to provide a voltage for the Vth low threshold level. As shown in FIG. 16, the transistor controlled by nctrl<1> provides the highest Vth low threshold voltage, while the transistor controlled by nctrl<N> provides the lowest Vth low threshold voltage, due to the number of corresponding resistors added in the path based on which transistor is turned on.

Transistor and resistor pairs 1614 and 1616 might be configurable to provide a selectably higher or lower voltage to transistor bank 1612 based on the value of MODE register 1642 (shown in FIG. 16 as inverted signal !MODE<0> for 1614 and non-inverted signal MODE<0> for 1616). As shown, each transistor and resistor pair 1614 and 1616 includes a resistor in coupled between the drain and source of the transistor. When the transistor of 1616 is on, substantially the voltage Vss is provided to 1614. When the transistor of 1614 is on, substantially the voltage provided by 1616 is provided to transistor bank 1612. When both transistors 1614 and 1616 are on, the minimum voltage is available to transistor bank 1612, and when both transistors 1604 and 1606 are off, a maximum voltage is available to transistor bank 1612. Intermediate voltages are provided by turning on only one transistor, and the voltage depends on the value of each resistor of 1614 and 1616. As shown in FIG. 16, in an exemplary embodiment, transistors 1602, 1604, 1606, 1608 and 1610 are PMOS transistors, and transistors 1612, 1614 and 1616 are NMOS transistors.

Table 3 shows an exemplary truth table of the control signals (nctrl, pctrl) generated by Demux 1618 and inverters 1620 based on the value of THRESHsel register 1644.

TABLE 3

| THRESHsel<2:0> | Nctrl<8:1> | Pctrl<8:1> |
| --- | --- | --- |
| 000 | 00000001 | 11111110 |
| 001 | 00000010 | 11111101 |
| 010 | 00000100 | 11111011 |
| 011 | 00001000 | 11110111 |
| 100 | 00010000 | 11101111 |
| 101 | 00100000 | 11011111 |
| 110 | 01000000 | 10111111 |
| 111 | 10000000 | 01111111 |

FIG. 16 also shows calibration engine 1640. As shown, calibration engine includes registers 1642-1658. As described in Table 2, PLLRESET register 1646 might be employed to initiate a reset of the PLL, for example by performing PLL initialization process 700 of FIG. 7. FvcoSEL register 1650 might select one of the N VCOs of the PLL for operation or calibration, where each of the N VCOs is configured to operate at increasing output frequencies, such as shown in FIG. 10. PLLband register 1652 might select a given tuning band of each VCO, such as shown in FIG. 10, where band 0 is the slowest VCO tuning band, and M-1 is the fastest VCO tuning band, for example achieved by switching the capacitors in the capacitor bank of each VCO. CALthresh register 1646 provides a wider or narrower Vtune voltage threshold window, such as shown in FIGS. 12-15. THRESHsel register 1644 selects the VCO calibration threshold window selection, where 0 corresponds to the smallest calibration threshold window and X corresponds to the largest calibration threshold window, as shown in FIG. 16 and Table 3. MODE register 1642 provides a programmable center voltage for the threshold window, as shown in FIGS. 12-15. PDH register 1658 might enable or disable the calibration circuitry, such as described in regard to FIG. 16.

Figure 17:
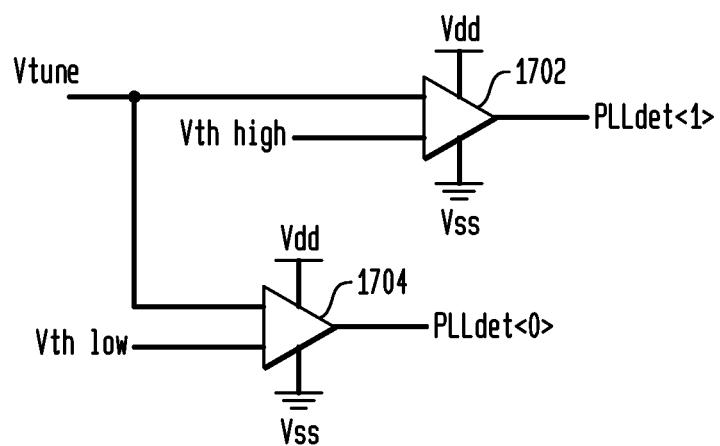
FIG. 17 shows an exemplary schematic diagram of a calibration circuit of the PLL in accordance with embodiments of the present invention.

FIG. 17 shows a schematic diagram of Vtune voltage threshold window comparator circuit 1700. As shown in FIG. 17, comparator circuit 1700 might include one or more comparators, shown as 1702 and 1704, to compare the Vtune voltage to the upper threshold voltage (Vth high) and lower threshold voltage (Vth low) generated by threshold window circuit 1600 of FIG. 16. As shown in FIG. 17, comparator 1702 might compare the Vtune voltage to the Vth high threshold voltage and generate an upper bit of the PLLdet value, and comparator 1704 might compare the Vtune voltage to the Vth low threshold voltage and generate a lower bit of the PLLdet value. The PLLdet value might be provided to calibration engine 1640 via register 1654, and might be used by calibration engine 1640 to determine whether the Vtune voltage is within the threshold window, for example at steps 908, 922 and 936 of calibration process 704. As shown in FIG. 17 and Table 2, PLLdet register 1654 might have the value of 00 when Vtune is in the window, 01 when Vtune is below the low threshold, and 10 when Vtune is above the upper threshold.

Figure 19:
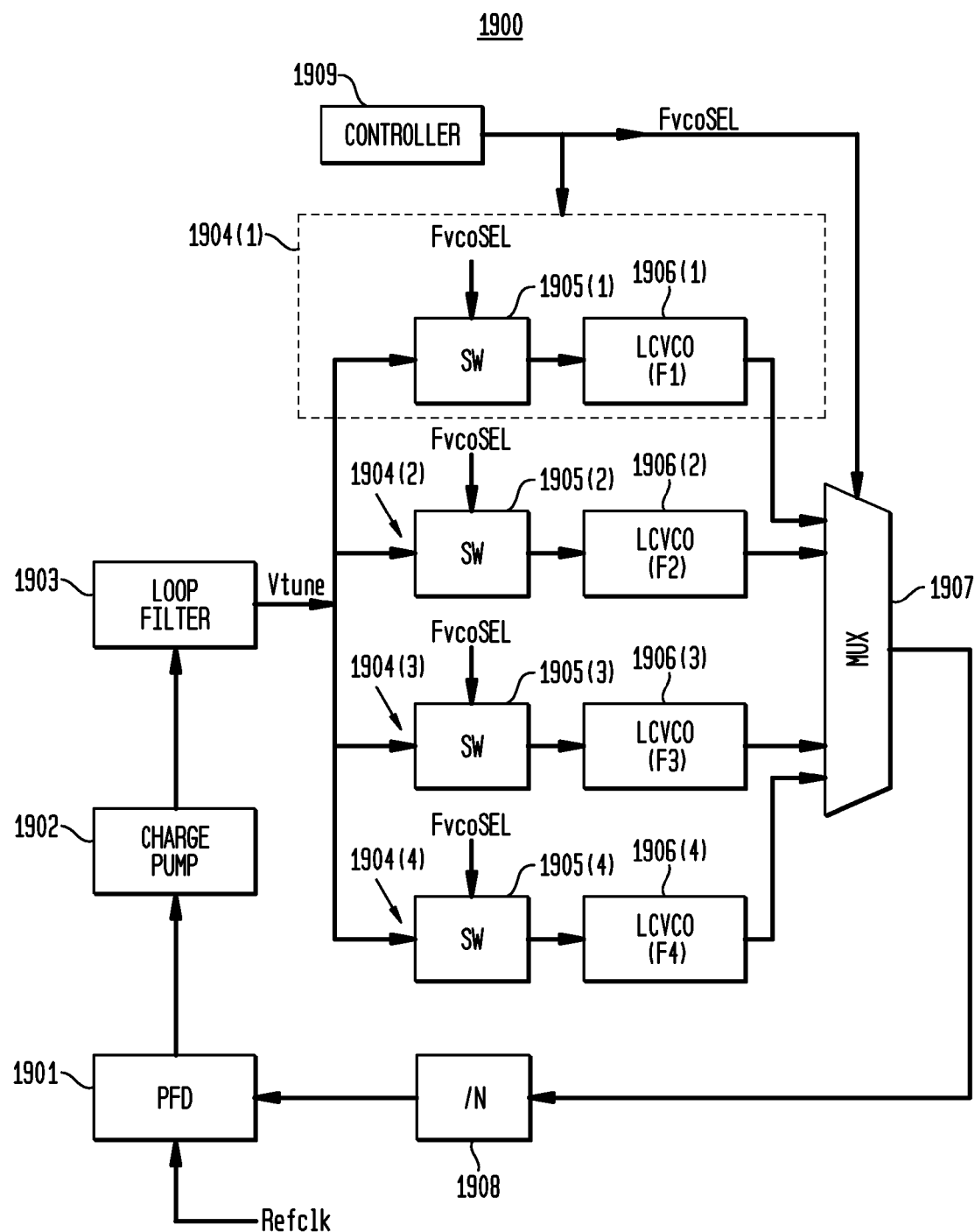
FIG. 19 shows an exemplary embodiment of wide tuning-range PLL employing multiple VCOs operating in accordance with embodiments of the present invention.

FIG. 19 shows an exemplary embodiment of wide-tuning range (WTR) PLL 1900 employing multiple VCOs operating in accordance with the present invention. WTR PLL 1900 comprises phase frequency detector (PFD) 1901, charge pump 1902, and loop filter 1903, which provides voltage Vtune to set the oscillation of a VCO. WTR PLL 1900 further comprises LCVCO paths 1904(1)-1904(4). Each of LCVCO paths 1904(1)-1904(4) includes corresponding switch and VCO operating at a given oscillation frequency. For example, LCVCO path 1904(1) comprises switch (SW) 1905(1) and LCVCO 1906(1) (operating with oscillation frequency (F1)). Each of LCVCOs 1906(1)-1906(4) provides clock signal to the channel over one of a set of multiple desired oscillation frequency bands. In addition, each of LCVCOs 1906(1)-1906(4) might comprise a VCO, followed with a level shifter, divider (e.g., divide-by-2 counter) and/or output buffer (not shown in FIG. 19) for the VCO output signal for various clock signal applications.

WTR PLL 1900 further comprises multiplexer (MUX) 1907, optional counter (divide-by-N) 1908, and device controller 1909. Controller 1909 might typically include calibration engine 1640. Controller 1909, coupled to MUX 1907 and each of SWs 1905(1)-1905(4), generates control signal, FvcoSEL, to select as output for WTR PLL 1900 the output of one of the LCVCO paths 1904(1)-1904(4). Controller 1909 might be implemented with a processor and software, or might be implemented as a simple state machine with corresponding state table for signal FvcoSEL. While FIG. 19 shows four LCVCO paths, the present invention is not so limited. One skilled in the art might employ less or more than four LCVCO paths based upon the teachings herein.

A lower frequency reference clock (Refclk) and a scaled version of the output from MUX 1907 is applied to PFD 1901, which generates an error signal proportional to the difference between its input signals. Based on this error signal, charge pump 1902 increases or decreases charge applied to the loop filter 1903 to produce Vtune. Charge from charge pump 1902 appears as a voltage Vtune that controls the oscillation frequency of a corresponding one of LCVCOs 1906(1)-1906(4) when enabled through action of FvcoSEL applied to a corresponding one of SWs 1905(1)-1905(4). The selected output signal from MUX 1907 is provided to counter 1908, which scales the output frequency by N, which scaled signal is then provided to PFD 1901.

The multiple LCVCO paths each require small tuning range for each of its VCOs, yielding relatively good jitter performance. High frequency oscillation is achieved by relieving the LCVCO capacitive loading from large switched-capacitor banks incorporated into the circuits of the LCVCOs. This provides for a high-speed PLL design. As described above, the LCVCO might incorporate a level shifter, a divider, and output buffers. LCVCO output frequencies might be divided by 2 with a counter before multiplexing. The divide-by-2 circuit might be individually tailored for the LCVCO coupled to it, when the frequencies from the multiple LCVCO paths are widely different. This divide by 2 operation also provides half-rate quadrature clocks naturally to the channel, which might satisfy the clocking needs for TX and RX phase-interpolation simultaneously. Buffers might act as repeaters for the clock distribution between various circuit component blocks. Disabled or otherwise dormant LCVCO paths might be powered down, reducing power consumption. Inductors are relatively small geometry for 10-30 GHz or even higher frequency oscillation, allowing for incorporation of multiple LCVCO paths in an SoC implementation of the WTR LCPLL.

Figure 20:
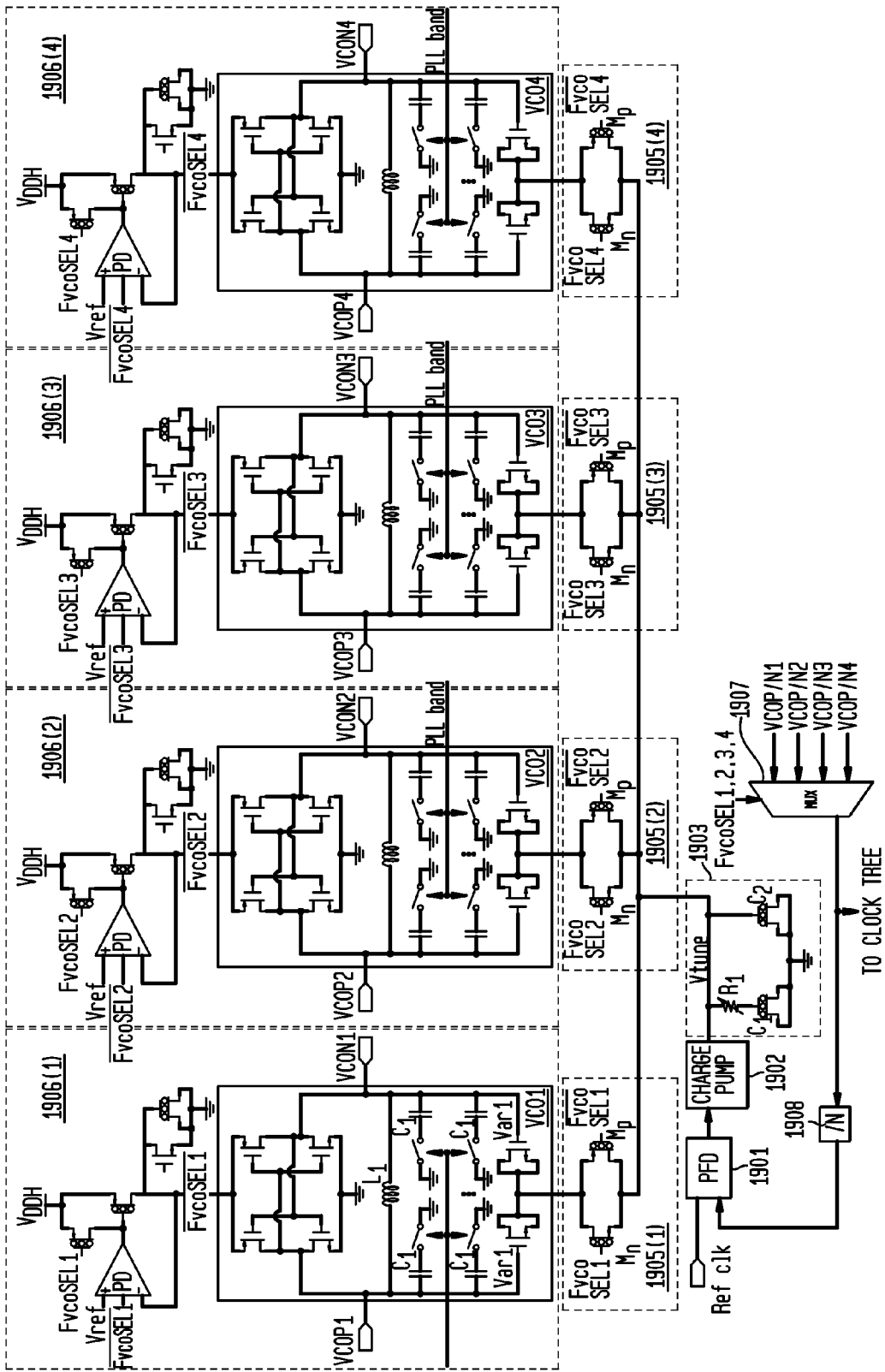
FIG. 20 shows an exemplary circuit implementation for a single, wide-range LCVCO of the PLL of FIG. 19.

FIG. 20 shows an exemplary circuit implementation for the single, wide-range LCVCO shown in FIG. 19. As shown, disabling not only occurs through operation of selected ones of SWs 1905(1)-1905(4) (e.g., via FvcoSEL), but also through selectively disabling the voltage supply circuitry of each of corresponding selected ones of LCVCOs 1906(1)-1906(4). Therefore, each dormant LCVCO is completely isolated from the active LCVCO and PLL loop. SWs 1905(1)-1905(4), enable or disable selected LCVCO paths of WTR PLL 1900 of FIG. 19 based on the control input signal FvcoSEL(1)-FvcoSEL(4). Based on the control signal FvcoSEL(1) (within control signal FvcoSEL from controller 1909), switch 1905(1) couples Vtune of loop filter 1908 to LCVCO 1906(1) when LCVCO 1906(1) is selected to provide the output oscillation signal. Concurrently, SWs 1905(2)-1905(4) are OFF to isolate the loop filter from the loading capacitances of these now dormant LCVCOs. The value of control signal FvsoSEL is set by FvcoSEL register 1650 of FIG. 16.

Figure 21:
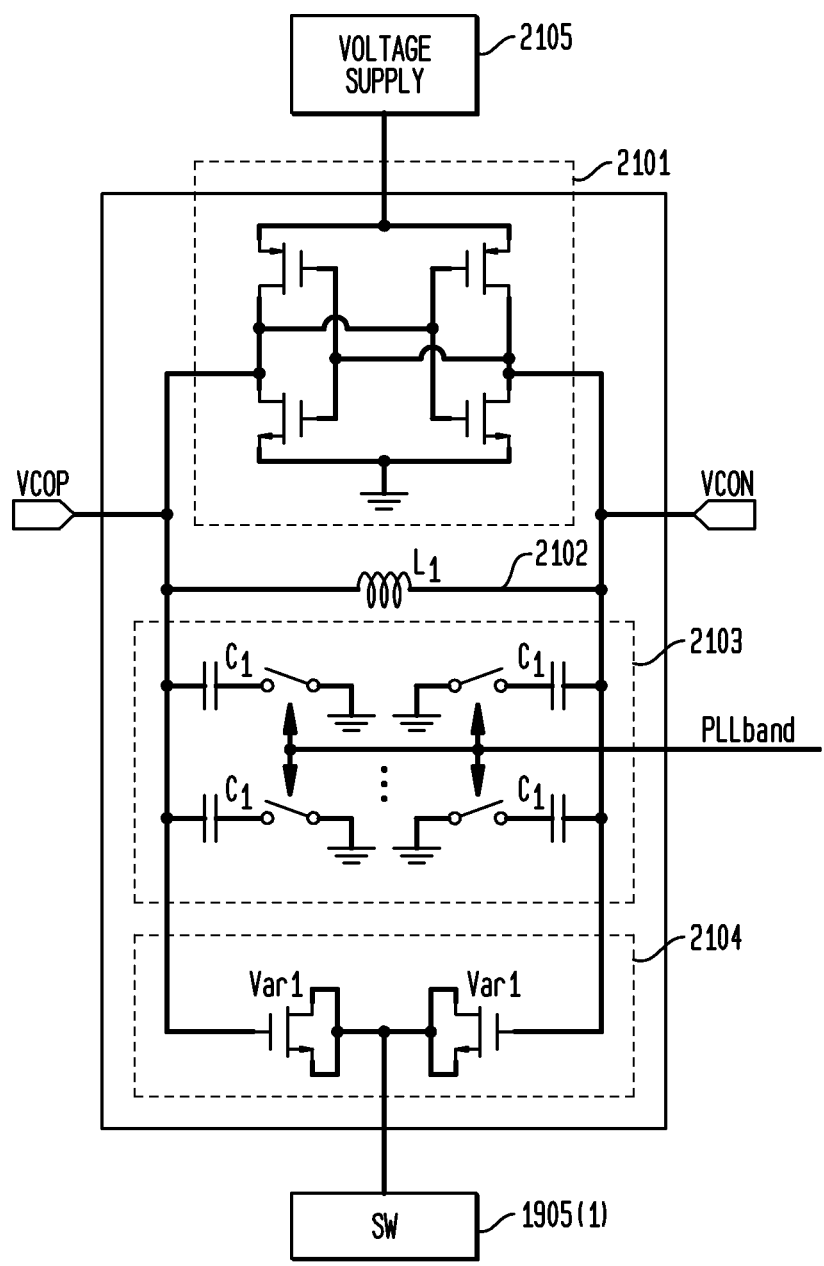
FIG. 21 shows an exemplary circuit implementation for the LCVCO of FIG. 19.

FIG. 21 shows an exemplary circuit implementation for LCVCO 1906(1) (other LCVCOs, e.g., LCVCOs 1906(2)-1906(4), might be implemented in a similar manner and operate analogously). LCVCO 1906(1) is implemented as a complimentary cross-coupled VCO architecture. LCVCO 1906(1) comprises a cross-coupled differential amplifier 2101 with an LC tank in its feedback path. This LC tank is composed of inductance provided by inductor 2102 (with exemplary inductive value L1) and a capacitance provided by parallel coupled varactors 2104 (with exemplary capacitive values Var1) and switched capacitor banks 2103 (with exemplary capacitive values $C_1$) that extend the tuning range of the VCO. The capacitance value of switched capacitor banks 2103 (e.g., the position of the switches) is selected by control signal PLLband, the value of which is set by PLLband register 1652 of FIG. 16. LCVCO 1906(1) is driven by low-noise voltage supply 2105.

Thus, embodiments of the present invention do not open the PLL feedback loop to force external voltages to the Vtune node during calibration, but align the PLL operating point to a target Vtune voltage by choosing a best VCO and a best tuning band from multiple switched-capacitor LCVCOs. Described embodiments employ adaptive Vtune voltage thresholds that are generated and can be modified if desired by the calibration engine during calibration rather than by employing preset thresholds that are fixed during calibration. The target Vtune voltage is programmable and set by register settings of the calibration engine. Described embodiments of the present invention provide PLL calibration for an optimal PLL operating voltage, Vtune, without decreasing the achievable frequency range of the PLL. Described embodiments also provide improved PVT performance by allowing for Vtune to be centered in the operating voltage threshold window, allowing greater flexibility to adjust Vtune either up or down to account for PVT variations.

While the exemplary embodiments of the present invention have been described with respect to processes of circuits, including possible implementation as a single integrated circuit, a multi-chip module, a single card, or a multi-card circuit pack, the present invention is not so limited.

As would be apparent to one skilled in the art, various functions of circuit elements might also be implemented as processing blocks in a software program. Such software might be employed in, for example, a digital signal processor, microcontroller, or general-purpose computer. Such software might be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Unless explicitly stated otherwise, each numerical value and range should be interpreted as being approximate as if the word "about" or "approximately" preceded the value of the value or range. Signals and corresponding nodes or ports might be referred to by the same name and are interchangeable for purposes here.

Transistors are typically shown as single devices for illustrative purposes. However, it is understood by those skilled in the art that transistors will have various sizes (e.g., gate width and length) and characteristics (e.g., threshold voltage, gain, etc.) and might consist of multiple transistors coupled in parallel to get desired electrical characteristics from the combination. Further, the illustrated transistors might be composite transistors.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

It will be further understood that various changes in the details, materials, and arrangements of the parts which have been described and illustrated in order to explain the nature of this invention might be made by those skilled in the art without departing from the scope of the invention as expressed in the following claims.

We claim:

1. A method of calibrating a phase-locked loop (PLL) by a calibration engine of the PLL, the PLL having one or more adjustable oscillators and a threshold window generation circuit, each of the adjustable oscillators providing a different output frequency, the threshold window generation circuit having a first configurable transistor bank configured to generate an upper threshold for a selected threshold window, a second configurable transistor bank configured to generate a lower threshold for the selected threshold window, a demultiplexer configured to generate a first control signal based on a control value of the calibration engine, the first control signal provided to the second configurable transistor bank, an inverter configured to generate a second control signal based on the first control signal, the second control signal provided to the first configurable transistor bank, a first comparator for comparing the upper threshold value to the control signal value, and a second comparator for comparing the lower threshold value to the control signal value, wherein the outputs of the first and second comparators are provided to the calibration engine, the method comprising:
 entering a calibration mode of the PLL;
 setting the PLL to an initial state, by:
  selecting one of the adjustable oscillators for calibration;
  selecting an initial threshold window; and
  selecting an initial tuning band of the selected adjustable oscillator;
 determining whether a control signal of the selected adjustable oscillator is within the initial threshold window; and
 if the control signal is not within the initial threshold window:
  iteratively adjusting at least one of: (i) the selected tuning band of the selected adjustable oscillator, (ii) the selected adjustable oscillator, and (iii) the selected threshold window until the control signal of the selected adjustable oscillator is within the adjusted threshold window;
  if the control signal is below the selected threshold window and (i) the lowest tuning band of the selected adjustable oscillator is selected, and (ii) the one of the adjustable oscillators of the PLL having the lowest operating frequency is selected:
   selecting a next larger threshold window if the largest threshold window of the PLL is not currently selected;

if the control signal is above the selected threshold window and (i) the highest tuning band of the selected adjustable oscillator is selected, and (ii) the one of the adjustable oscillators of the PLL having the highest operating frequency is selected:
selecting a next larger threshold window if the largest threshold window of the PLL is not currently selected;
otherwise, if the control signal is within the initial threshold window:
storing the one or more calibration settings of the PLL in a memory.

2. The method of claim 1, wherein the step of iteratively adjusting at least one of: (i) the selected tuning band of the selected adjustable oscillator, (ii) the selected adjustable oscillator, and (iii) the selected threshold window, further comprises:
if the control signal is below the selected threshold window:
selecting a next lower tuning band of the selected adjustable oscillator if the selected tuning band of the selected adjustable oscillator is not a lowest tuning band;
otherwise, if the control signal is above the selected threshold window:
selecting a next higher tuning band of the selected adjustable oscillator if the selected tuning band of the selected adjustable oscillator is not a highest tuning band.

3. The method of claim 2, further comprising:
if the control signal is below the selected threshold window and the lowest tuning band of the selected adjustable oscillator is selected:
selecting one of the adjustable oscillators of the PLL having a next lower operating frequency if the current selected one of the adjustable oscillators of the PLL is not at the lowest operating frequency;
otherwise, if the control signal is above the selected threshold window and the highest tuning band of the selected adjustable oscillator is selected:
selecting one of the adjustable oscillators of the PLL having a next higher operating frequency if the current selected one of the adjustable oscillators of the PLL is not at the highest operating frequency.

4. The method of claim 1, further comprising:
if the control signal is below the selected threshold window, the lowest tuning band of the selected adjustable oscillator is selected, the one of the adjustable oscillators of the PLL having the lowest operating frequency is selected, and the largest threshold window is selected:
indicating an error condition that Vtune is below the threshold window for non-calibration;
if the control signal is above the selected threshold window, the highest tuning band of the selected adjustable oscillator is selected, the one of the adjustable oscillators of the PLL having the highest operating frequency is selected, and the largest threshold window is selected:
indicating an error condition that Vtune is above the threshold window for non-calibration.

5. The method of claim 4, wherein the step of iteratively adjusting at least one of: (i) the selected tuning band of the selected adjustable oscillator, (ii) the selected adjustable oscillator, and (iii) the selected threshold window further comprises:
adjusting one or more control registers of the calibration engine.

6. The method of claim 5, wherein, for the method, the one or more control registers comprise:

a first register configured to select a given threshold window;
a second register configured to adjust a width of the selected threshold window;
a third register configured to select a center value of the selected threshold window;
a fourth register configured to select one of the adjustable oscillators of the PLL for operation and calibration;
a fifth register configured to select a tuning band of the selected adjustable oscillator; and
a sixth register configured to enable and disable a calibration circuit of the PLL.

7. The method of claim 1, wherein, for the method, the one or more adjustable oscillators comprise one or more voltage controlled oscillators (VCOs).

8. The method of claim 1, wherein the method is iteratively repeated for each of the one or more adjustable oscillators of the PLL.

9. A phase-locked loop (PLL) comprising:
one or more adjustable oscillators, each of the adjustable oscillators configured to generate different output frequency;
a calibration engine configured to:
place the PLL in a calibration mode;
set the PLL to an initial state, the initial state thereby selecting one of the adjustable oscillators for calibration, an initial threshold window, and an initial tuning band of the selected adjustable oscillator;
determine whether a control signal of the selected adjustable oscillator is within the initial threshold window;
if the control signal is not within the initial threshold window:
iteratively adjust at least one of: (i) the selected tuning band of the selected adjustable oscillator, (ii) the selected adjustable oscillator, and (iii) the selected threshold window until the control signal of the selected adjustable oscillator is within the adjusted threshold window; and
when the control signal is within the threshold window:
store the one or more calibration settings of the to a memory; and
a threshold window generation circuit comprising:
a first configurable transistor bank configured to generate an upper threshold for the selected threshold window;
a second configurable transistor bank configured to generate a lower threshold for the selected threshold window;
a demultiplexer configured to generate a first control signal based on a control value of the calibration engine, the first control signal provided to the second configurable transistor bank;
an inverter configured to generate a second control signal based on the first control signal, the second control signal provided to the first configurable transistor bank;
a first comparator for comparing the upper threshold value to the control signal value; and
a second comparator for comparing the lower threshold value to the control signal value, wherein the outputs of the first and second comparators are provided to the calibration engine.

10. The PLL of claim 9, wherein the threshold window generation circuit further comprises:
one or more configurable transistor and resistor pairs, the resistors coupled drain-to-source of the corresponding transistor, wherein the one or more configurable transistor and resistor pairs are configured to provide a selectable voltage to the first and second transistor banks.

11. The PLL of claim 9, wherein the calibration engine is further configured to:
if the control signal is below the selected threshold window:
select a next lower tuning band of the selected adjustable oscillator if a current tuning band of the selected adjustable oscillator is not a lowest tuning band;
otherwise, if the control signal is above the selected threshold window:
select a next higher tuning band of the selected adjustable oscillator if a current tuning band of the selected adjustable oscillator is not a highest tuning band.

12. The PLL of claim 11, wherein the calibration engine is further configured to:
if the control signal is below the selected threshold window and the lowest tuning band of the selected adjustable oscillator is selected:
select one of the adjustable oscillators of the PLL having a next lower operating frequency if the current selected one of the adjustable oscillators of the PLL is not at the lowest operating frequency;
if the control signal is above the selected threshold window and the highest tuning band of the selected adjustable oscillator is selected:
select one of the adjustable oscillators of the PLL having a next higher operating frequency if the current selected one of the adjustable oscillators of the PLL is not at the highest operating frequency.

13. The PLL of claim 12, wherein the calibration engine is further configured to:
if the control signal is below the selected threshold window, the lowest tuning band of the selected adjustable oscillator is selected, and the one of the adjustable oscillators of the PLL having the lowest operating frequency is selected:
select a next larger threshold window if the largest threshold window of the PLL is not currently selected;
if the control signal is above the selected threshold window, the highest tuning band of the selected adjustable oscillator is selected, and the one of the adjustable oscillators of the PLL having the highest operating frequency is selected:
select a next larger threshold window if the largest threshold window of the PLL is not currently selected.

14. The PLL of claim 13, wherein the calibration engine is further configured to:
if the control signal is below the selected threshold window, the lowest tuning band of the selected adjustable oscillator is selected, the one of the adjustable oscillators of the PLL having the lowest operating frequency is selected, and the largest threshold window is selected:
indicate an error condition that Vtune is below the threshold window for non-calibration;
if the control signal is above the selected threshold window, the highest tuning band of the selected adjustable oscillator is selected, the one of the adjustable oscillators of the PLL having the highest operating frequency is selected, and the largest threshold window is selected:
indicate an error condition that Vtune is above the threshold window for non-calibration.

15. The PLL of claim 9, wherein calibration engine is configured to adjust one or more control registers of the calibration engine, wherein the one or more control registers comprise:
a first register configured to select a given threshold window;
a second register configured to adjust a width of the selected threshold window;
a third register configured to select a center value of the selected threshold window;
a fourth register configured to select one of the adjustable oscillators of the PLL for operation and calibration;
a fifth register configured to select a tuning band of the selected adjustable oscillator; and
a sixth register configured to enable and disable a calibration circuit of the PLL.

16. The PLL of claim 9, wherein the one or more adjustable oscillators comprise one or more voltage controlled oscillators (VCOs).

17. The PLL of claim 9, wherein the calibration engine is configured to iteratively calibrate each of the one or more adjustable oscillators of the PLL.

18. The PLL of claim 9, wherein the PLL is implemented in an integrated circuit (IC).

* * * * *